US012633347B2

(12) United States Patent
Ahn et al.

(10) Patent No.: US 12,633,347 B2
(45) Date of Patent: May 19, 2026

(54) MEMORY DEVICE WITH SOFT PROGRAMMED DUMMY CELLS AND METHOD OF OPERATING THE SAME

(71) Applicant: SK hynix Inc., Icheon-si (KR)

(72) Inventors: Sang Tae Ahn, Icheon-si (KR); Sung Min Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 96 days.

(21) Appl. No.: 18/356,051

(22) Filed: Jul. 20, 2023

(65) Prior Publication Data

US 2024/0249774 A1      Jul. 25, 2024

(30) Foreign Application Priority Data

Jan. 19, 2023    (KR) ........................ 10-2023-0007736

(51) Int. Cl.
*G11C 16/10* (2006.01)
*G11C 16/14* (2006.01)
*G11C 16/04* (2006.01)
*H10B 43/35* (2023.01)

(52) U.S. Cl.
CPC .............. *G11C 16/10* (2013.01); *G11C 16/14* (2013.01); *G11C 16/0483* (2013.01); *H10B 43/35* (2023.02)

(58) Field of Classification Search
CPC ..... G11C 16/10; G11C 16/14; G11C 16/0483; G11C 7/227; G11C 16/32; G11C 11/5628; G11C 16/08; G11C 16/16;

G11C 16/24; G11C 16/3409; G11C 16/12; G11C 16/34; G11C 16/30; G11C 16/3404; H10B 43/35; H10B 43/27
See application file for complete search history.

(56) References Cited

U.S. PATENT DOCUMENTS

| | | | | |
|---|---|---|---|---|
| 2015/0221385 A1* | 8/2015 | Ahn | ........................ | G11C 16/14 |
| | | | | 365/185.2 |
| 2016/0336071 A1* | 11/2016 | Park | ................... | G11C 16/3459 |
| 2021/0375365 A1* | 12/2021 | Lee | ........................ | G11C 16/10 |
| 2023/0024971 A1* | 1/2023 | Huang | ............... | G11C 16/0483 |
| 2023/0162807 A1* | 5/2023 | Choi | .................. | G11C 16/3418 |
| | | | | 365/185.02 |

FOREIGN PATENT DOCUMENTS

| | | |
|---|---|---|
| KR | 101916192 B1 | 11/2018 |
| KR | 1020210146093 A | 12/2021 |

* cited by examiner

*Primary Examiner* — Jerome Leboeuf
(74) *Attorney, Agent, or Firm* — WILLIAM PARK AND ASSOCIATES LTD.

(57) ABSTRACT

A memory device includes a memory block including strings, each including first memory cells coupled between a first dummy cell and a second dummy cell and second memory cells coupled between third dummy cell and fourth dummy cell, and a peripheral circuit performing a normal program operation on first and second memory cells, or a soft program operation on first to fourth dummy cells, wherein the peripheral circuit is configured to, perform a soft program operation on the fourth dummy cell which is farthest from an area to which the precharge voltage is applied and perform a normal program operation on second memory cells, wherein the precharge voltage is applied to the area during the normal program operation, and wherein the area is adjacent to the first dummy cells.

8 Claims, 25 Drawing Sheets

(1sVpgm>2sVpgm>Vpass)

(1sVpgm>2sVpgm>Vpass)

| S44 OR S46 | | | |
|---|---|---|---|
| 1PGM_L | 2PGM_L | · · · | kPGM_L |

(1sVpgm>2sVpgm>3sVpgm>Vpass)

FIG. 12

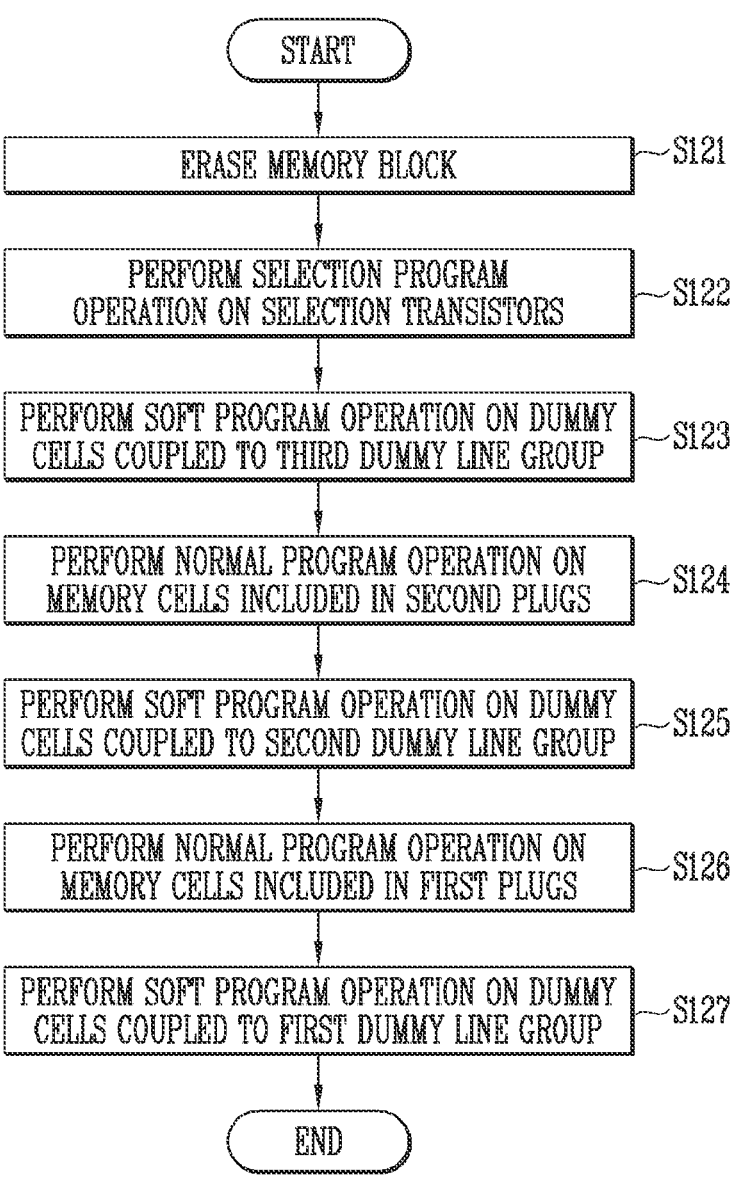

START

ERASE MEMORY BLOCK — S121

PERFORM SELECTION PROGRAM
OPERATION ON SELECTION TRANSISTORS — S122

PERFORM SOFT PROGRAM OPERATION ON DUMMY
CELLS COUPLED TO THIRD DUMMY LINE GROUP — S123

PERFORM NORMAL PROGRAM OPERATION ON
MEMORY CELLS INCLUDED IN SECOND PLUGS — S124

PERFORM SOFT PROGRAM OPERATION ON DUMMY
CELLS COUPLED TO SECOND DUMMY LINE GROUP — S125

PERFORM NORMAL PROGRAM OPERATION ON
MEMORY CELLS INCLUDED IN FIRST PLUGS — S126

PERFORM SOFT PROGRAM OPERATION ON DUMMY
CELLS COUPLED TO FIRST DUMMY LINE GROUP — S127

END (1sVpgm>2sVpgm>Vpass)

(1sVpgm>2sVpgm>3Vpgm>Vpass)

(1sVpgm>2sVpgm>Vpass)

(1sVpgm>2sVpgm>3sVpgm>Vpass)

MEMORY DEVICE WITH SOFT PROGRAMMED DUMMY CELLS AND METHOD OF OPERATING THE SAME

CROSS-REFERENCE TO RELATED APPLICATION

The present application claims priority under 35 U.S.C. § 119(a) to Korean patent application number 10-2023-0007736 filed on Jan. 19, 2023, in the Korean Intellectual Property Office, the entire disclosure of which is incorporated by reference herein.

BACKGROUND

1. Technical Field

Various embodiments of the present disclosure relate to a memory device and a method of operating the memory device, and more particularly to a memory device including dummy cells and a program operation of the memory device.

2. Related Art

A memory device may include a memory cell array in which data is stored, a peripheral circuit which performs a program operation, a read operation, or an erase operation, and a control circuit which controls the peripheral circuit.

The memory cell array may include a plurality of memory blocks, each of which may include a plurality of memory cells. A memory device having a three-dimensional (3D) structure may include memory cells stacked on a substrate. For example, the memory device having a 3D structure may include plugs that are vertical to the substrate. Each of the plugs may include memory cells, dummy cells, and selection transistors formed between bit lines and a source line. The memory cells, the dummy cells, and the selection transistors between the bit lines and the source line may form strings.

The memory cells may store user data or normal data. The dummy cells may store dummy data to prevent the deterioration of electrical characteristics of memory cells included in the string. The selection transistors may be used to couple or decouple bit lines or source lines to or from strings.

During a program operation on a memory block, the channel voltages of selected strings need to be decreased or the channel voltages of unselected strings need to be increased. In order to increase the channel voltages of the unselected strings, a precharge voltage may be applied through the source lines or the bit lines. However, as the heights of plugs forming the memory block are increased, it may be difficult to precharge unselected strings.

SUMMARY

An embodiment of the present disclosure may provide for a memory device. The memory device may include a memory block including strings, each including first memory cells coupled between a first dummy cell and a second dummy cell and second memory cells coupled between a third dummy cell and a fourth dummy cell, the third dummy cell being adjacent to the second dummy cell, and a peripheral circuit configured to perform an erase operation on the memory block, a normal program operation on the first and second memory cells, or a soft program operation on the first to fourth dummy cells. The peripheral circuit may be configured to, after the performing the erase operation on the memory block, perform a soft program operation on the fourth dummy cell, among the first to fourth dummy cells, which is farthest away from an area to which the precharge voltage is applied, and perform a normal program operation on the second memory cells, wherein the precharge voltage is applied to the area during the normal program operation, and wherein the area is adjacent to the first dummy cells.

An embodiment of the present disclosure may provide for a memory device. The memory device may include a memory block including strings, each including first memory cells coupled between first dummy cells and second dummy cells and second memory cells coupled between third dummy cells and fourth dummy cells, the third dummy cell being adjacent to the second dummy cells, and a peripheral circuit configured to perform an erase operation on the memory block, a normal program operation on the first and second memory cells, or a soft program operation on the first to fourth dummy cells. The peripheral circuit may be configured to, after performing the erase operation on the memory block, perform a soft program operation on the fourth dummy cells, among the first to fourth dummy cells, farthest away from an area to which the precharge voltage is applied, and perform a normal program operation on the second memory cells, wherein the precharge voltage is applied to the area during the normal program operation, and wherein the area is adjacent to the first dummy cells.

BRIEF DESCRIPTION OF THE DRAWINGS

FIG. 12 is a flowchart illustrating a program operation according to a fifth embodiment of the present disclosure.

DETAILED DESCRIPTION

Specific structural or functional descriptions, disclosed herein, are exemplified to describe embodiments according to the concept of the present disclosure. The embodiments according to the concept of the present disclosure should not be construed as being limited to embodiments described below and may be modified in various forms and replaced with other equivalent embodiments.

Hereinafter, it will be understood that, although the terms "first" and "second" may be used herein to describe various elements, these elements should not be limited by these terms. The terms are used to distinguish one element from other elements.

Various embodiments of the present disclosure are directed to a memory device that is capable of improving the reliability of a program operation and a method of operating the memory device.

Figure 1:
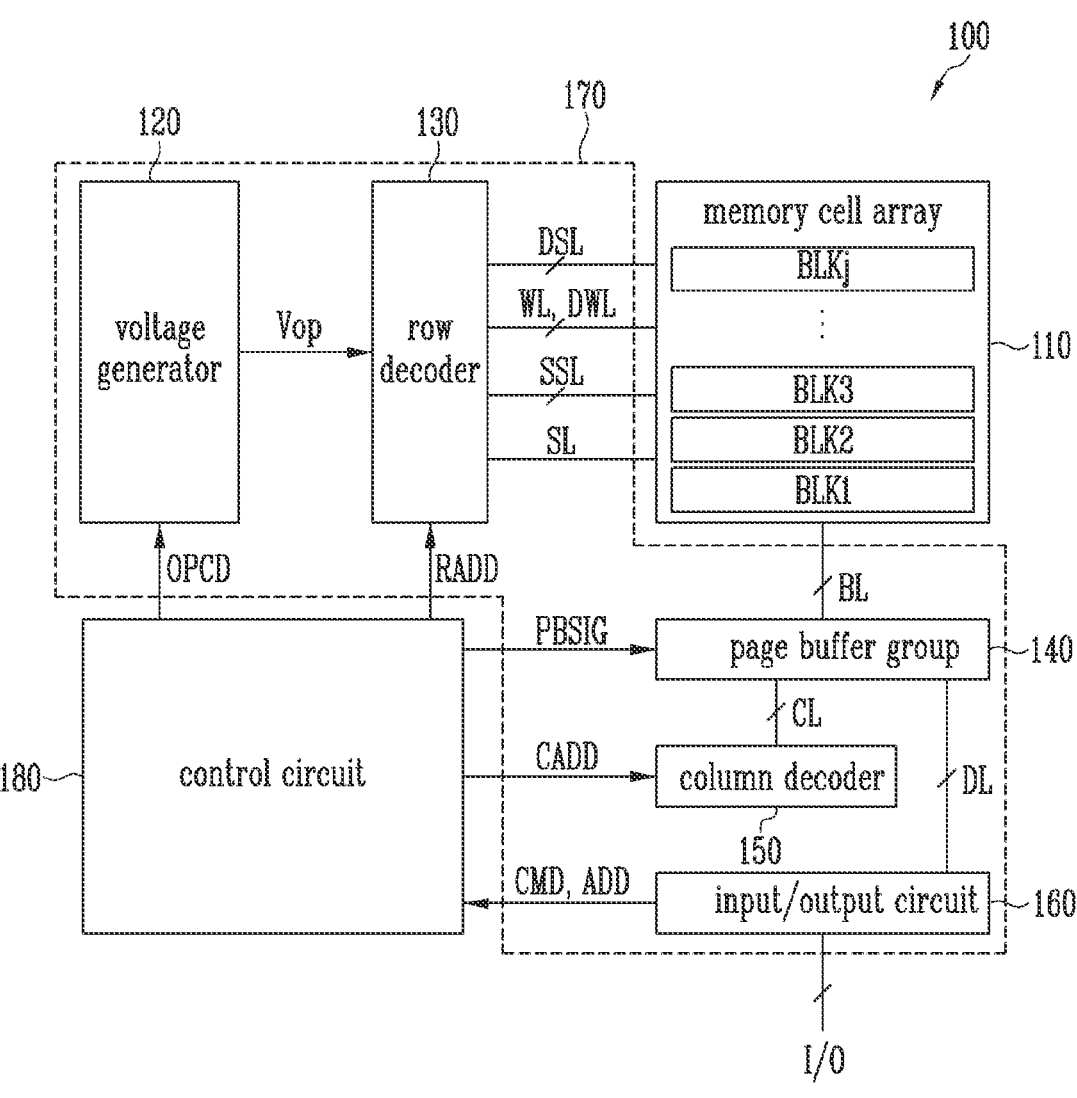
FIG. 1 is a diagram illustrating a memory device according to an embodiment of the present disclosure.

FIG. 1 is a diagram illustrating a memory device according to an embodiment of the present disclosure.

Referring to FIG. 1, a memory device 100 may include a memory cell array 110, a peripheral circuit 170, and a control circuit 180.

The memory cell array 110 may include first to j-th memory blocks BLK1 to BLKj. Each of the first to j-th memory blocks BLK1 to BLKj may include a plurality of memory cells in which data can be stored. Drain select lines DSL, word lines WL, dummy lines DWL, source select lines SSL, and a source line SL may be coupled to each of the first to j-th memory blocks BLK1 to BLKj. Bit lines BL may be coupled in common to the first to j-th memory blocks BLK1 to BLKj. The first to j-th memory blocks BLK1 to BLKj may be formed in a three-dimensional (3D) structure. Each of the memory blocks having a 3D structure may include memory cells stacked on a substrate.

According to a program scheme, each memory cell may store 1 bit of data or 2 or more bits of data. For example, a scheme for storing 1 bit of data in one memory cell is referred to as a single-level cell (SLC) scheme, and a scheme for storing 2 bits of data in one memory cell is referred to as a multi-level cell (MLC) scheme. A scheme for storing 3 bits of data in one memory cell is referred to as a triple-level cell (TLC) scheme, and a scheme for storing 4 bits of data in one memory cell is referred to as a quad-level cell (QLC) scheme. In addition, 5 or more bits of data may be stored in one memory cell.

The peripheral circuit 170 may perform a program operation that stores data in the memory cell array 110, a read operation that outputs data stored in the memory cell array 110, and an erase operation that erases data stored in the memory cell array 110. For example, the peripheral circuit 170 may include a voltage generator 120, a row decoder 130, a page buffer group 140, a column decoder 150, and an input/output circuit 160.

The voltage generator 120 may generate various operating voltages Vop required for a program operation, a read operation, or an erase operation in response to an operation code OPCD. For example, the voltage generator 120 may generate program voltages, soft program voltages, turn-on voltages, turn-off voltages, a precharge voltage, negative voltages, verify voltages, read voltages, pass voltages, or erase voltages in response to the operation code OPCD. The operating voltages Vop generated by the voltage generator 120 may be applied to the drain select lines DSL, the word lines WL, the dummy lines DWL, the source select lines SSL, and the source line SL of a selected memory block through the row decoder 130.

The program voltages may be voltages that are applied to the selected word line, among the word lines WL, during a program operation and may be used to increase the threshold voltages of memory cells coupled to the selected word line. The soft program voltages may be voltages that are applied to a selected dummy line and may be used to increase the threshold voltages of erased dummy cells after an erase operation is performed on the memory block. The turn-on voltages may be applied to the drain select lines DSL or the source select lines SSL and may be used to turn on drain selection transistors or source selection transistors. The turn-off voltages may be applied to the drain select lines DSL or the source select lines SSL and may be used to turn off drain selection transistors or source selection transistors. For example, the turn-off voltage may be set to 0 V. The negative voltages may be set to voltages that are lower than 0 V. The precharge voltage may be applied to the source line and may be used to increase channel voltages of unselected strings during a soft program or normal program operation. The verify voltages may be used for a verify operation that determines whether the threshold voltages of the selected memory cells have increased up to target levels. The verify voltages may be set to various levels based on the target levels and may be applied to the selected word line. The read voltages may be applied to the selected word line during a read operation on the selected memory cells. The pass voltages may be voltages that are applied to unselected word lines or dummy lines during a program operation and may be used to turn on memory cells coupled to the unselected word lines or dummy cells coupled to the dummy lines. The erase voltages may be used for an erase operation that erases the memory cells included in the selected memory block and may be applied to the source line SL.

In response to the operation code OPCD, the voltage generator 120 may control the levels of voltages that are applied to the drain select lines DSL, the word lines WL, the dummy lines DWL, the source select lines SSL, and the source line SL and the times during which the voltages are output. The voltage generator 120 may discharge the lines to which the operating voltages Vop have been applied and may control the times at which the lines are discharged. The voltage generator 120 may allow the selected lines to float.

The row decoder 130 may transfer the operating voltages Vop to the drain select lines DSL, the word lines WL, the source select lines SSL, and the source line SL, which are coupled to a memory block selected in response to a row address RADD. For example, the row decoder 130 may be coupled to the voltage generator 120 through global lines and may be coupled to the first to j-th memory blocks BLK1 to BLKj through the drain select lines DSL, the word lines WL, the dummy lines DWL, the source select lines SSL, and the source line SL.

The page buffer group 140 may include page buffers (not illustrated) coupled to the first to j-th memory blocks BLK1 to BLKj through the bit lines BL. During a program operation, program data transferred from the input/output circuit 160 may be stored in the page buffer group 140. The page buffer group 140 may apply a program-enable voltage or a program-inhibit voltage to the bit lines BL based on the program data in response to page buffer control signals PBSIG. During a verify operation, the page buffer group 140 may sense the currents or voltages of the bit lines BL that vary based on the threshold voltages of the selected memory cells and may store sensed data.

The column decoder 150 may be configured such that data is transferred between the page buffer group 140 and the input/output circuit 160 in response to a column address CADD. For example, the column decoder 150 may be coupled to the page buffer group 140 through column lines CL and may transmit enable signals through the column lines CL. The page buffers (not illustrated) included in the page buffer group 140 may receive or output data through data lines DL in response to the enable signals.

The input/output circuit 160 may receive or output a command CMD, an address ADD, or data through input/output lines I/O. For example, the input/output circuit 160 may transmit the command CMD and the address ADD, received from an external controller through the input/output lines I/O, to the control circuit 180 and may transmit the data, received from the external controller through the input/output lines I/O, to the page buffer group 140. Alternatively, the input/output circuit 160 may output data, received from the page buffer group 140, to the external controller through the input/output lines I/O.

The control circuit 180 may output the operation code OPCD, the row address RADD, the page buffer control signals PBSIG, and the column address CADD in response to the command CMD and the address ADD. For example, when the command CMD input to the control circuit 180 is a command corresponding to a program operation, the control circuit 180 may control the peripheral circuit 170 so that a program operation is performed on a memory block selected by the address ADD. When the command CMD input to the control circuit 180 is a command corresponding to a read operation, the control circuit 180 may control the peripheral circuit 170 so that a read operation is performed on a memory block selected by the address and read data is output. When the command CMD input to the control circuit 180 is a command corresponding to an erase operation, the control circuit 180 may control the peripheral circuit 170 so that an erase operation is performed on a selected memory block.

During a program operation according to the present embodiment, the control circuit 180 may perform a soft program operation after an erase operation is performed on the selected memory block. For example, the control circuit 180 may control the peripheral circuit 170 to perform a soft program operation on dummy cells located relatively far away from an area to which a precharge voltage for increasing channel voltages is applied and to perform a soft program operation on the remaining dummy cells during a normal program operation performed on the memory cells.

Figure 2:
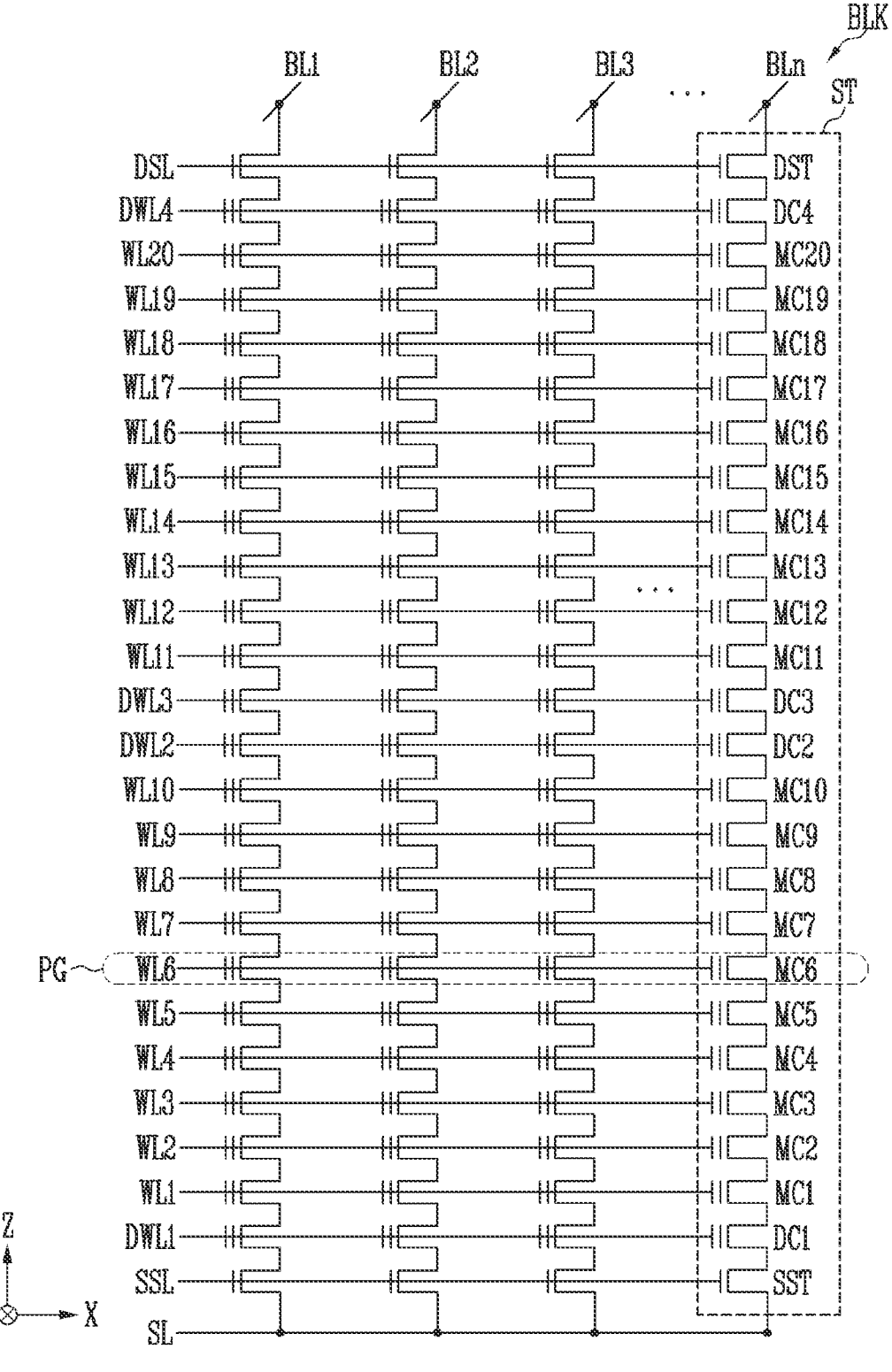
FIG. 2 is a circuit diagram illustrating a memory block according to an embodiment of the present disclosure.

FIG. 2 is a circuit diagram illustrating a memory block according to an embodiment of the present disclosure.

Referring to FIG. 2, a memory block BLK may be any one of the first to j-th memory blocks BLK1 to BLKj, illustrated in FIG. 1. The memory block BLK may include strings ST coupled between first to n-th bit lines BL1 to BLn and a source line SL. For example, the strings ST may be coupled in common to the source line SL and may be coupled to the first to n-th bit lines BL1 to BLn, respectively. The structure of the string ST coupled between the n-th bit line BLn and the source line SL will be described by way of an example.

The string ST may include a source selection transistor, dummy cells, memory cells, and a drain selection transistor, which are coupled in series to each other between the source line SL and the n-th bit line BLn. For example, the string ST may include a source selection transistor SST, a first dummy cell DC1, first to tenth memory cells MC1 to MC10, second and third dummy cells DC2 and DC3, eleventh to twenties memory cells MC11 to MC20, a fourth dummy cell DC4, and a drain selection transistor DST. Because the string ST, illustrated in FIG. 2, is illustrated as an example for explaining the connection component of the memory block BLK, the numbers of source selection transistors, dummy cells, memory cells, and drain selection transistors that are included in the string ST may vary based on the memory device.

The source selection transistor SST may electrically connect or disconnect the source line SL to or from the first dummy cell DC1. Gates of source selection transistors SST included in different strings ST may be coupled to a source select line SSL. During a program operation, a turn-on voltage or a turn-off voltage may be applied to the source select line SSL. During the program operation, a precharge voltage or a ground voltage may be applied to the source line SL.

The first dummy cell DC1 may be used to electrically connect or disconnect the source selection transistor SST to or from the first memory cell MC1. The first dummy cell DC1 may also be used to prevent electrical interference between the source selection transistor SST and the first memory cell MC1. Therefore, dummy data, instead of normal data, may be stored in the first dummy cell DC1. Gates of first dummy cells DC1 included in different strings ST may be coupled to a first dummy line DWL1.

The first to twentieth memory cells MC1 to MC20 may store normal data. Gates of the first to twentieth memory cells MC1 to MC20 included in different strings ST may be coupled to first to twentieth word lines WL1 to WL20, respectively. For example, the gates of the first memory cells MC1 included in different strings ST may be coupled to the first word line WL1, and the gates of the second memory cells MC2 included in different strings ST may be coupled to the second word line WL2. In this way, the third to twentieth memory cells MC3 to MC20 may be coupled to the third to twentieth word lines WL3 to WL20, respectively. A group of memory cells coupled to the same word line may form a page (PG), and a program operation may be performed on a page-by-page basis.

The second and third dummy cells DC2 and DC3 may be coupled between the tenth and eleventh memory cells MC10 and MC11. For example, the second dummy cell DC2 may be coupled between the tenth memory cell MC10 and the third dummy cell DC3, and the third dummy cell DC3 may be coupled between the second dummy cell DC2 and the eleventh memory cell MC11. The second and third dummy cells DC2 and DC3 may be arranged in an area in which electrical characteristics are deteriorated or in which the difference between electrical characteristics is relatively large in the string ST. The arrangement of the second and third dummy cells DC2 and DC3 will be described in detail later with reference to FIG. 3.

Because the second and third dummy cells DC2 and DC3 are used to compensate for the deterioration of electrical characteristics in the string, dummy data, instead of the normal data, may be stored in the second and third dummy cells DC2 and DC3. Gates of the second dummy cells DC2 included in different strings ST may be coupled to a second dummy line DWL2, and gates of the third dummy cells DC3 may be coupled to a third dummy line DWL3.

The drain selection transistor DST may electrically connect or disconnect the bit line coupled to the string ST to or from the fourth dummy cell DC4. Gates of drain selection transistors DST included in different strings ST may be coupled to a drain select line DSL. During a program operation, a turn-on voltage or a turn-off voltage may be applied to the drain select line DSL. During the program operation, the program-enable voltage or the program-inhibit voltage may be applied to the first to n-th bit lines BL1 to BLn.

Figure 3:
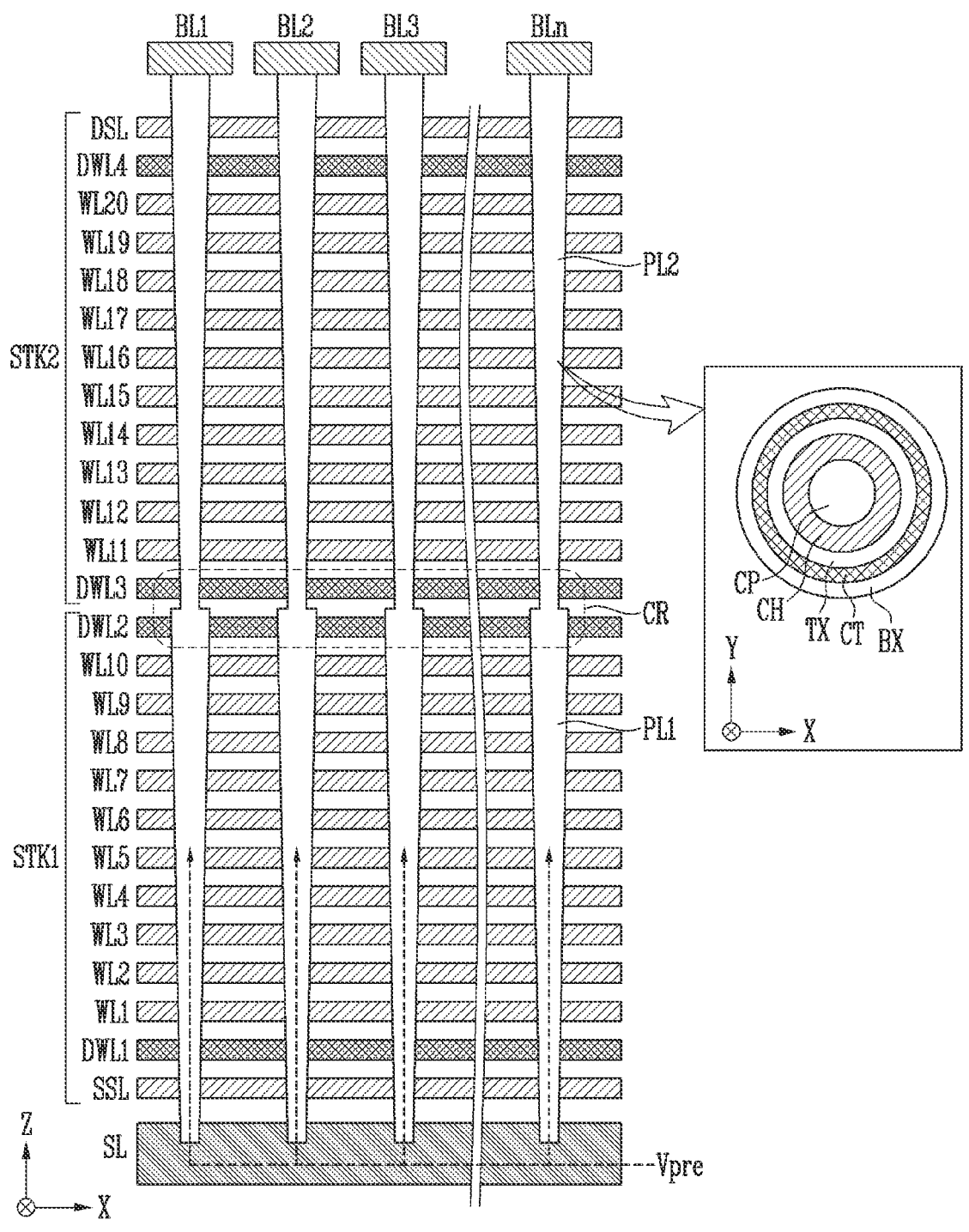
FIG. 3 is a sectional view of a memory block for explaining an embodiment of the present disclosure.

FIG. 3 is a sectional view of a memory block for explaining an embodiment of the present disclosure.

Referring to FIG. 3, the memory block may include first and second stacked structures STK1 and STK2 stacked on a source line SL. Because FIG. 3 illustrates the structure of the memory block as an example, the number of stacked structures included in the memory block may vary based on the memory device.

The first stacked structure STK1 may be stacked on the source line SL, and the second stacked structure STK2 may be stacked on the first stacked structure STK1. Although not illustrated in the drawing, a substrate or a peripheral circuit may be disposed below the source line SL.

The first stacked structure STK1 may include a source select line SSL, a first dummy line DWL1, first to tenth word lines WL1 to WL10, and a second dummy line DWL2, which are stacked, and may include first plugs PL1 penetrating the source select line SSL, the first dummy line DWL1, the first to tenth word lines WL1 to WL10, and the second dummy line DWL2. The first plugs PL1 may contact the source line SL disposed below the first stacked structure STK1.

The second stacked structure STK2 may include a third dummy line DWL3, eleventh to twentieth word lines WL11 to WL20, a fourth dummy line DWL4, and a drain select line DSL, which are stacked, and may include second plugs PL2 penetrating the third dummy line DWL3, the eleventh to twentieth word lines WL11 to WL20, the fourth dummy line DWL4, and the drain select line DSL. The second plugs PL2 may contact first to n-th bit lines BL1 to BLn disposed on the second stacked structure STK2. The second plugs PL2 may be formed on the first plugs PL1.

The source select line SSL, the first to fourth dummy lines DWL1 to DWL4, the first to twentieth word lines WL1 to WL20, and the drain select line DSL, which are included in the first and second stacked structures STK1 and STK2, may be formed of a conductive material, such as tungsten (W), molybdenum (Mo), cobalt (Co) or nickel (Ni), or a semiconductor material, such as silicon (Si) or polysilicon (Poly- Si), and may also be formed of any of various types of metal materials in addition to the above-described materials.

Each of the first and second plugs PL1 and PL2 may include a cylindrical blocking layer BX, a charge trap layer CT formed along an inner wall of the blocking layer BX, a tunnel isolation layer TX formed along an inner wall of the charge trap layer CT, a channel layer CH formed along an inner wall of the tunnel isolation layer TX, and a core plug CP formed in a cylindrical shape in an area enclosed by the channel layer CH. Each of the blocking layer BX and the tunnel isolation layer TX may be formed of a silicon oxide layer. The charge trap layer CT may be formed of a nitride layer. The channel layer CH may be formed of a doped silicon layer. The core plug CP may be formed of an insulating layer or a conductive layer. The blocking layer BX, the charge trap layer CT, the tunnel isolation layer TX, the channel layer CH, and the core plug CP, which are formed in the first and second plugs PL1 and PL2, may extend in a vertical direction Z.

Because the second stacked structure STK2 is formed on the top of the first stacked structure STK1 after the first stacked structure STK1 is formed, the tops of the first plugs PL1 may contact the bottoms of the corresponding second plugs PL2. The width of each of the first and second plugs PL1 and PL2 may be gradually increased when measuring from the bottom to the top. Therefore, in a connection region CR in which a portion having the largest width in each first plug PL1 contacts a portion having the smallest width in each second plug PL2, the difference between the widths of the first and second plugs PL1 and PL2 is maximized. In this way, when the memory cells are formed in the connection region CR in which the width difference is maximized, an electrical difference between the memory cells may occur, and thus, reliability may be deteriorated during a program or read operation. Due to the deterioration of reliability in the connection region CR, the memory cells formed in the connection region CR may be designated as second or third dummy cells that store dummy data. For example, memory cells disposed in the uppermost portion of the first plug PL1 may be designated as second dummy cells, and memory cells disposed in the lowermost portion of the second plug PL2 may be designated as third dummy cells. Therefore, the second dummy line DWL2 coupled to the second dummy cells may be formed in the uppermost portion of the first stacked structure STK1, and the third dummy line DWL3 coupled to the third dummy cells may be formed in the lowermost portion of the second stacked structure STK2.

When an erase operation is performed on the memory block illustrated in FIG. 3, a selection program operation that increases the threshold voltages of source selection transistors and drain selection transistors may be performed before a normal program operation is performed. The selection program operation performed on the source selection transistors and the drain selection transistors may be skipped.

When the erase operation or the selection program operation is performed, a soft program operation that stores dummy data in dummy cells may be performed before a normal program operation is performed. Because the dummy data does not have a specific pattern, the storage of the dummy data in the dummy cells may mean that the threshold voltages of the dummy cells become higher than threshold voltages in an erase state.

During the program operation according to first to fourth embodiments, a precharge voltage Vpre may be applied through the source line SL during a normal program operation that programs the memory cells. The precharge voltage Vpre may be a voltage for increasing the channel voltages of unselected strings. During the program operation according to the first to fourth embodiments, the memory cells may be sequentially programmed from the drain select line DSL to the source select line SSL.

During the program operation according to the first to fourth embodiments, a soft program operation may be performed on fourth dummy cells located farthest away from the source line SL to which the precharge voltage Vpre is applied, among the first to fourth dummy cells, and a soft program operation on the remaining first to third dummy cells may be performed while the normal program operation is being performed.

The program operation according to the first embodiment will be described in detail below.

Figure 4:
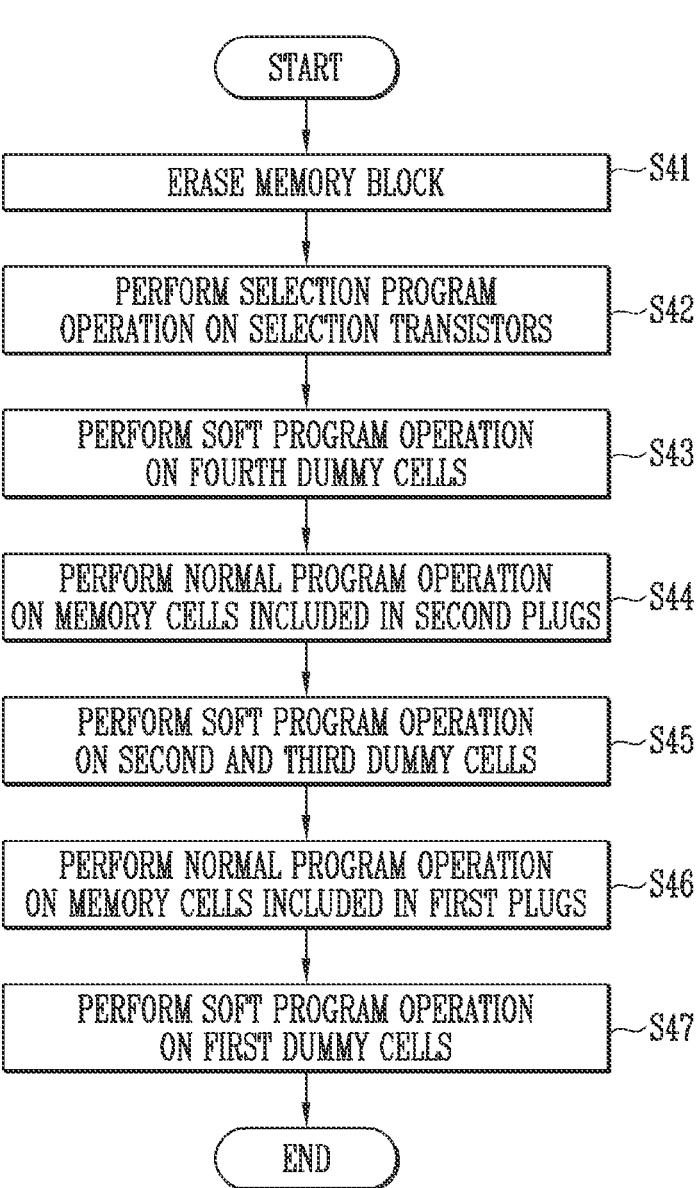
FIG. 4 is a flowchart illustrating a program operation according to the present disclosure.

FIG. 4 is a flowchart illustrating a program operation according to the present disclosure.

Referring to FIGS. 2 to 4, when an erase operation is performed on the memory block at step S41, a selection program operation may be performed on selection transistors at step S42. For example, the selection program operation may be performed to increase the threshold voltages of source selection transistors and drain selection transistors, which are decreased by the erase operation, up to a target select voltage.

When the threshold voltages of the selection transistors are increased up to the target select voltage, a soft program operation that increases the threshold voltages of the fourth dummy cells DC4 may be performed at step S43. For example, the soft program operation on the fourth dummy cells DC4 may be performed such that the threshold voltages of the fourth dummy cells DC4 have a first voltage that is higher than threshold voltages in an erase state. When the soft program operation is performed on the fourth dummy cells DC4 at step S43, the remaining dummy cells, that is, the first to third dummy cells DC1 to DC3 may be maintained in an erase state.

When the soft program operation on the fourth dummy cells DC4 is terminated, a normal program operation may be performed on the memory cells included in the second plugs PL2 at step S44. That is, the normal program operation may be performed on the eleventh to twentieth memory cells MC11 to MC20 coupled between the third and fourth dummy cells DC3 and DC4. During the normal program operation on the memory cells included in the second plugs PL2, a positive precharge voltage Vpre may be applied through the source line SL to increase the channel voltages of the unselected strings. The normal program operation on the memory cells included in the second plugs PL2 may be sequentially performed in the order from the twentieth memory cells MC20 to the eleventh memory cells MC11. For example, a normal program operation may be performed on the twentieth memory cells MC20 adjacent to the fourth dummy cells DC4 on which the soft program operation has been performed and then may perform a normal program operation on nineteenth to eleventh memory cells MC19 to MC11.

When the normal program operation on the memory cells included in the second plugs PL2 is terminated, a soft program operation may be performed on the second and third dummy cells DC2 and DC3 at step S45. For example, when the normal program operation on the eleventh memory cells MC11 included in the second plugs PL2 is terminated, the soft program operation may be performed on the second and third dummy cells DC2 and DC3 adjacent to the eleventh memory cells MC11. Although the soft program operation on the second and third dummy cells DC2 and DC3 is performed to increase the threshold voltage of the second and third dummy cells DC2 and DC3, it may be performed to have threshold voltages that are lower than that of the fourth dummy cells DC4. When the soft program operation is performed on the second and third dummy cells DC2 and DC3 at step S45, the remaining dummy cells, that is, the first dummy cells DC1, may be maintained in an erase state.

When the soft program operation on the second and third dummy cells DC2 and DC3 is terminated, a normal program operation may be performed on the memory cells included in the first plug PL1 at step S46. That is, the normal program operation may be performed on the first to tenth memory cells MC1 to MC10 coupled between the first and second dummy cells DC1 and DC2. During the normal program operation on the memory cells included in the first plugs PL1, the positive precharge voltage Vpre may be applied through the source line SL to increase the channel voltages of the unselected strings. The normal program operation on the memory cells included in the first plugs PL1 may be sequentially performed in the order from the tenth memory cells MC10 to the first memory cells MC1. For example, the normal program operation may be performed on the tenth memory cells MC10 adjacent to the second dummy cells DC2 on which the soft program operation has been performed and then may perform the normal program operation on the ninth to first memory cells MC9 to MC1.

When the normal program operation on the memory cells included in the first plugs PL1 is terminated, a soft program operation may be performed on the first dummy cells DC1 at step S47. For example, when the normal program operation on the first memory cells MC1 included in the first plugs PL1 is terminated, the soft program operation may be performed on the first dummy cells DC1 adjacent to the first memory cells MC1. Although the soft program operation on the first dummy cells DC1 is performed to increase the threshold voltage of the first dummy cells DC1, it may be performed to have threshold voltages that are lower than that of the fourth dummy cells DC4. For example, the soft program operation on the first dummy cells DC1 may be performed such that the threshold voltages of the first dummy cells DC1 are equal to the threshold voltages of the second and third dummy cells DC2 and DC3.

Figure 5:
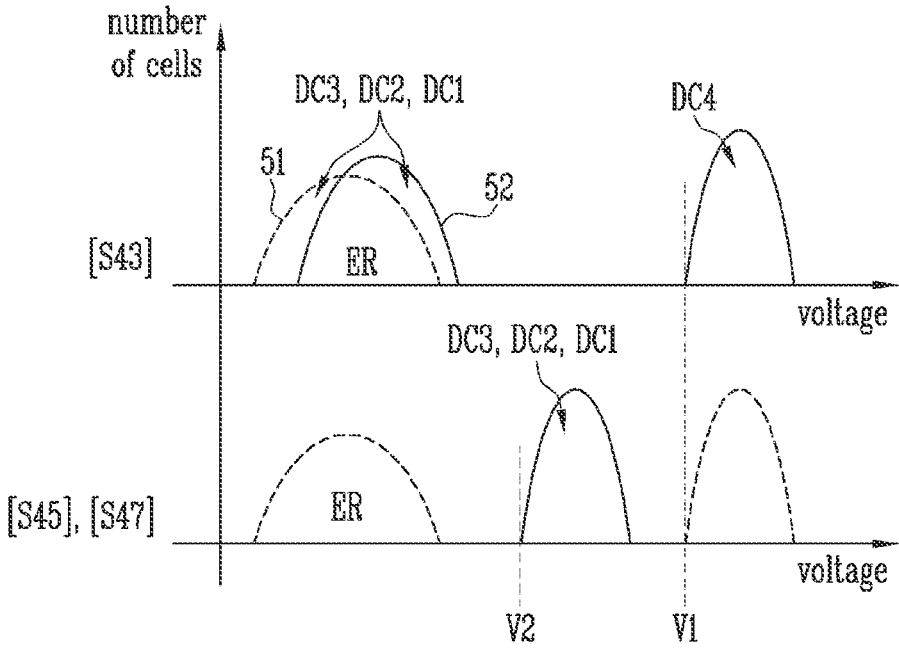
FIG. 5 is a diagram illustrating threshold voltage distributions of dummy cells according to a first embodiment of the present disclosure.

FIG. 5 is a diagram illustrating threshold voltage distributions of dummy cells according to a first embodiment of the present disclosure.

Referring to FIGS. 3 to 5, during the soft program operation performed on the fourth dummy cells DC4 at step S43, the remaining dummy cells, that is, the first to third dummy cells DC1 to DC3, may be maintained in an erased state ER (51) but may be weakly programmed to slightly increase the threshold voltages (52). For this, during the soft program operation performed on the fourth dummy cells DC4, a positive sub-voltage that is lower than a soft program voltage may be applied to the first to third dummy lines. Here, the soft program voltage may be a voltage applied to the fourth dummy line DWL4 to program the fourth dummy cells DC4.

At step S43, when the threshold voltage of the fourth dummy cells DC4 is increased up to a first voltage V1, the first to third dummy cells DC1 to DC3 may be programmed to have threshold voltages of a second voltage V2 that is lower than the first voltage V1 at step S45 or S47. For example, the second and third dummy cells DC2 and DC3 may be programmed at step S45, and the first dummy cells DC1 may be programmed at step S47. The second voltage V2 may be a positive voltage that is higher than the threshold voltage in the erase state ER or lower than the first voltage V1.

In this way, when the threshold voltage of the fourth dummy cells DC4 rises prior to those of the first to third dummy cells DC1 to DC3, a precharge voltage may be easily applied to unselected strings during a program operation performed on memory cells disposed between the third and fourth dummy cells DC3 and DC4 and on memory cells disposed between the first and second dummy cells DC1 and DC2. For example, when the memory cells from the twentieth memory cells MC20 to the first memory cells MC1 are sequentially programmed, the precharge voltage Vpre for precharging channels of unselected strings may be supplied through the source line SL. In this case, dummy cells located farther away from the source line SL may be first programmed such that the precharge voltage Vpre supplied through the source line SL is easily transferred.

A program operation according to a first embodiment will be described in detail below.

Figures 6A, 6B:
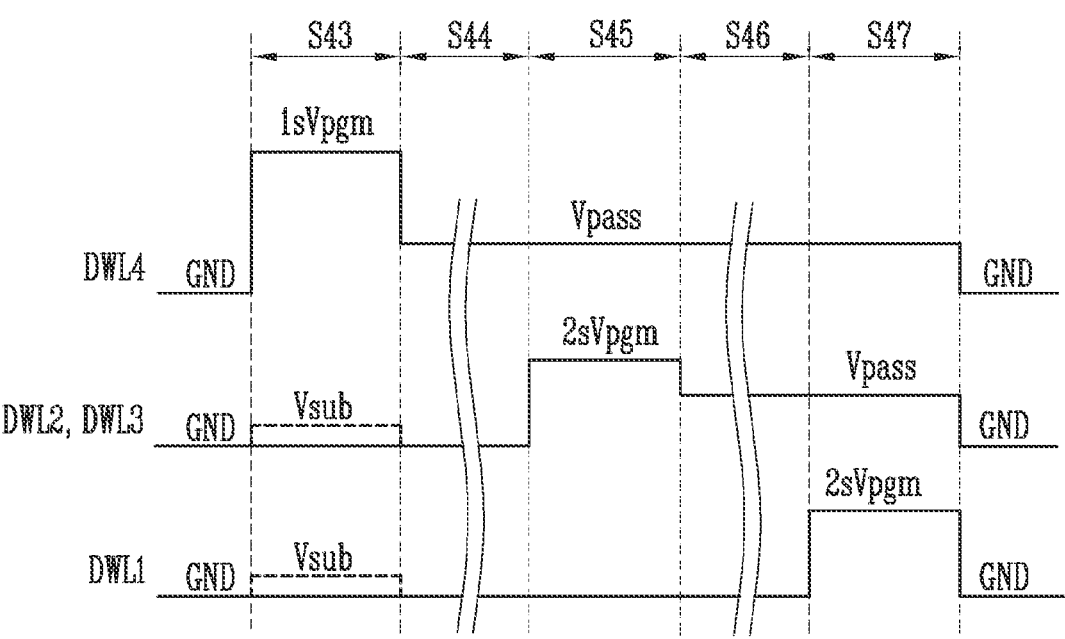
FIGS. 6A to 6C are timing diagrams illustrating a program operation according to a first embodiment of the present disclosure.
Figure 6C:
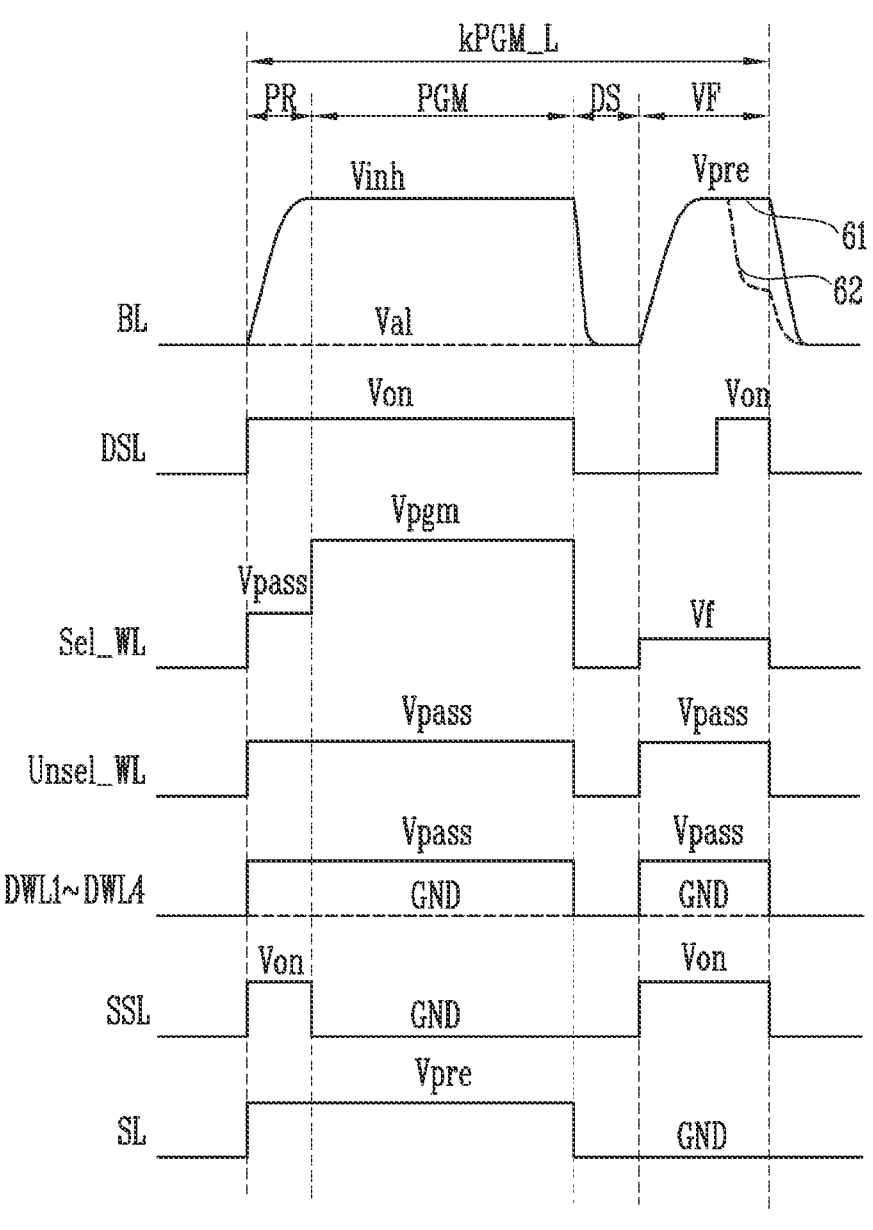

FIGS. 6A to 6C are timing diagrams illustrating a program operation according to a first embodiment of the present disclosure.

FIG. 6A is a diagram for explaining voltages applied to dummy lines while a soft program operation is being performed on dummy cells during the entire program operation performed on a memory block in a time order, and FIGS. 6B and 6C are diagrams for explaining a normal program operation performed between soft program operations.

Referring to FIGS. 3, 4, and 6A, when the program operation on the memory block begins, a first soft program voltage 1sVpgm may be applied to a fourth dummy line DWL4 located farthest away from the source line SL, among first to fourth dummy lines DWL1 to DWL4, at step S43. Here, a ground voltage GND or a positive sub-voltage Vsub may be applied to the first to third dummy lines DWL1 to DWL3 so that the first to third dummy cells DC1 to DC3 are maintained in an erase state. Here, the sub-voltage Vsub may be set to a low positive voltage so that the first to third dummy cells DC1 to DC3 are not changed to a program state. For example, the sub-voltage Vsub may be set to a value between 0 V and 1 V. The ground voltage GND may be 0 V.

After step S43 is terminated, a normal program operation may be performed on eleventh to twentieth memory cells MC11 to MC20 disposed between the third and fourth dummy cells DC3 and DC4 at step S44. While the normal program operation is being performed on the eleventh to twentieth memory cells MC11 to MC20, a pass voltage Vpass for turning on the fourth dummy cells DC4 may be applied to the fourth dummy line DWL4.

After step S44 is terminated, a second soft program voltage 2sVpgm may be applied to the second and third dummy lines DWL2 and DWL3 coupled to the second and third dummy cells DC2 and DC3 at step S45. Here, the pass voltage Vpass may be applied to the fourth dummy line DWL4, and the ground voltage GND may be applied to the first dummy line DWL1. Because the pass voltage Vpass is a voltage for turning on dummy cells, it may be set to a positive voltage. The second soft program voltage 2sVpgm may be higher than the pass voltage Vpass, and the first soft program voltage 1sVpgm may be higher than the second soft program voltage 2sVpgm.

After step S45 is terminated, a normal program operation may be performed on first to tenth memory cells MC1 to MC10 disposed between the first and second dummy cells DC1 and DC2 at step S46. While the normal program operation is being performed on the first to tenth memory cells MC1 to MC10, the pass voltage Vpass for turning on the second to fourth dummy cells DC2 to DC4 may be applied to the second to fourth dummy lines DWL2 to DWL4.

After step S46 is terminated, the second soft program voltage 2sVpgm may be applied to the first dummy line DWL1 coupled to the first dummy cells DC1. Here, the pass voltage Vpass may be applied to the second to fourth dummy lines DWL2 to DWL4.

Referring to FIGS. 6B and 6C, the normal program operation performed at step S44 or S46 may be performed using an incremental step pulse programming (ISPP) scheme. For example, during the normal program operation based on the ISPP scheme, first to k-th program loops 1PGM_L to kPGM_L may be performed until the threshold voltages of selected memory cells included in a selected page are increased to a target voltage. Each of the first to k-th program loops 1PGM_L to kPGM_L may include a precharge step PR, a program step PGM, a discharge step DS, and a verify step VF. The k-th program loop kPGM_L will be described below by way of an example.

When the precharge step PR begins, a program-enable voltage Val may be applied to selected bit lines, among bit lines BL, and a program-inhibit voltage Vinh may be applied to unselected bit lines. The program-enable voltage Val may be set to the ground voltage, and the program-inhibit voltage Vinh may be set to a positive voltage that is higher than the program-enable voltage Val. The precharge voltage Vpre may be applied to the source line SL. The precharge voltage Vpre may be set to a positive voltage that is higher than 0 V. In order to electrically connect the bit lines BL to the strings, a turn-on voltage Von may be applied to a drain select line DSL and a source select line SSL, and the pass voltage may be applied to a selected word line Sel_WL and unselected word lines Unsel_WL. The pass voltage Vpass may be applied to dummy lines coupled to dummy cells on which the soft program operation has been performed, among the first to fourth dummy lines DWL1 to DWL4, and the ground voltage GND may be applied to dummy lines coupled to dummy cells in an erase state. At the precharge step PR, the program-enable voltage Val may be applied to the selected bit lines, whereby the unselected strings coupled to the unselected bit lines may be precharged. For example, the channel voltages of the unselected strings may be increased.

When the program step PGM begins, the ground voltage GND may be applied to the source select line SSL to turn off source selection transistors. A program voltage Vpgm may be applied to the selected word line Sel_WL.

When the program step PGM is performed for a certain period of time, the discharge step DS of initializing the voltages of all lines may be performed. At the discharge step DS, the potentials of all lines may be decreased to the level of the ground voltage GND.

Subsequently, the verify step VF may be performed. When the verify step VF begins, the precharge voltage Vpre may be applied to the bit lines BL, and the turn-on voltage Von may be applied to the source select line SSL. Here, the source line SL may be maintained at the ground voltage GND. A verify voltage Vf may be applied to the selected word line Sel_WL, and the pass voltage Vpass may be applied to the unselected word lines Unsel_WL. The pass voltage Vpass may be applied to dummy lines coupled to dummy cells on which the soft program operation has been performed, among the first to fourth dummy lines DWL1 to DWL4, and the ground voltage GND may be applied to dummy lines coupled to dummy cells in an erase state. When the turn-on voltage Von is applied to the drain select line DSL to turn on drain selection transistors, the voltages of the bit lines BL may be changed based on the threshold voltages of the memory cells. For example, memory cells having threshold voltages that are higher than the verify voltage Vf, among the memory cells coupled to the selected word line Sel_WL, may be turned off. The potentials of the bit lines coupled to the strings including the turned-off memory cells may be maintained at the precharge voltage (61). Memory cells having threshold voltages that are lower than the verify voltage Vf, among the memory cells coupled to the selected word line Sel_WL, may be turned on.

Because the bit lines coupled to the strings including the turned-on memory cells may be electrically connected to the source line SL to which the ground voltage GND is applied, the potentials of the bit lines may become lower than the precharge voltage Vpre (62).

During the normal program operation described above with reference to FIG. 6C, the remaining voltages other than the voltages applied to the first to fourth dummy lines DWL1 to DWL4 may be changed in various manners.

Figure 7:
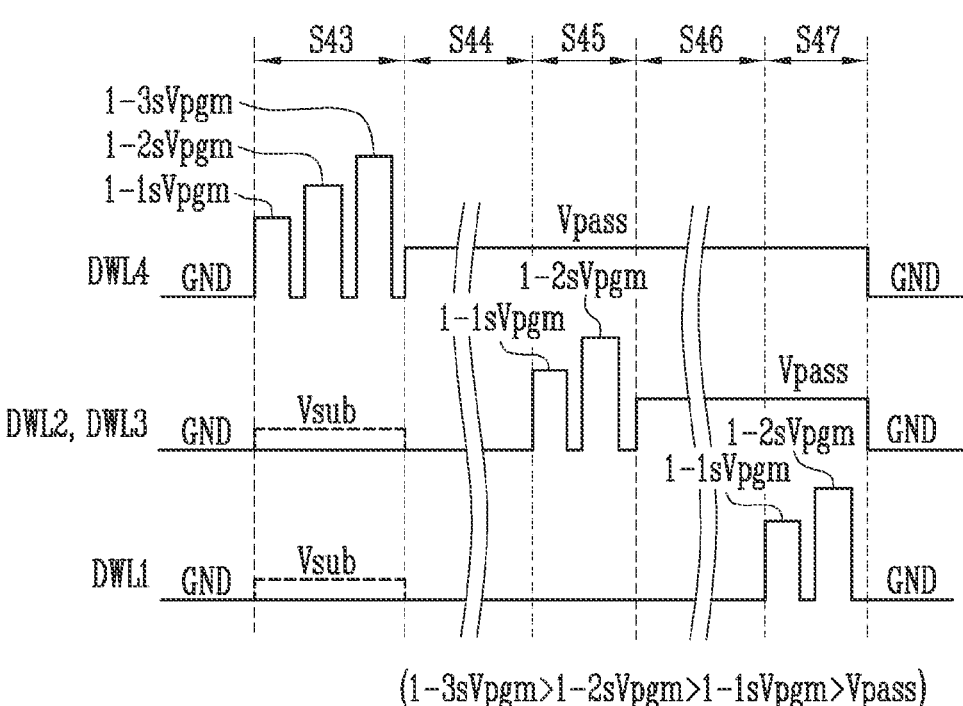
FIG. 7 is a timing diagram illustrating a program operation according to a second embodiment of the present disclosure.

FIG. 7 is a timing diagram illustrating a program operation according to a second embodiment of the present disclosure.

Referring to FIGS. 2 and 7, during a soft program operation performed on dummy cells, soft program voltages that increase in a stepwise manner may be applied to dummy lines. During a soft program operation that programs fourth dummy cells DC4 at step S43, 1-1-th to 1-3-th soft program voltages 1-1sVpgm to 1-3sVpgm that are increased in a stepwise manner may be applied to the fourth dummy line DWL4. For example, the 1-1-th soft program voltage 1-1sVpgm that is higher than the pass voltage Vpass may be applied to the fourth dummy line DWL4, and the 1-2-th soft program voltage 1-2sVpgm that is higher than the 1-1-th soft program voltage 1-1sVpgm may be applied thereto, and then the 1-3-th soft program voltage 1-3sVpgm that is higher than the 1-2-th soft program voltage 1-2sVpgm may be applied thereto. That is, as in the case in which a verify operation is skipped in the ISPP scheme, the 1-1-th to 1-3-th soft program voltages 1-1sVpgm to 1-3sVpgm that are increased in a stepwise manner may be applied to the fourth dummy line DWL4. At step S43, a ground voltage GND or a positive sub-voltage Vsub may be applied to the first to third dummy lines DWL1 to DWL3 so that the first to third dummy cells DC1 to DC3 are maintained in an erase state.

After step S43 is terminated, step S44 may be performed. Because step S44 is identical to step S44 of FIG. 6A, repeated descriptions thereof will be omitted.

After step S44 is terminated, the 1-1-th and 1-2-th soft program voltages 1-1sVpgm and 1-2sVpgm that are increased in a stepwise manner may be applied to the second and third dummy lines DWL2 and DWL3. For example, the 1-1-th soft program voltage 1-1sVpgm that is higher than the pass voltage Vpass may be applied to the second and third dummy lines DWL2 and DWL3, and then the 1-2-th soft program voltage 1-2sVpgm that is higher than the 1-1-th soft program voltage 1-1sVpgm may be applied thereto. The highest voltage, among the soft program voltages used at step S45, may be set to a voltage that is lower than the highest voltage, among the soft program voltages used at step S43. The number of soft program voltages applied to the second and third dummy lines DWL2 and DWL3 at step S45 may be less than or equal to the number of soft program voltages applied to the fourth dummy line DWL4 at step S43. At step S45, the pass voltage Vpass may be applied to the fourth dummy line DWL4, and the ground voltage GND may be applied to the first dummy line DWL1 so that the first dummy cells DC1 are maintained in an erase state.

After step S45 is terminated, step S46 may be performed. Because step S46 is identical to step S46 of FIG. 6A, repeated descriptions thereof will be omitted.

After step S46 is terminated, the 1-1-th and 1-2-th soft program voltages 1-1sVpgm and 1-2sVpgm that are increased in a stepwise manner may be applied to the first dummy line DWL1. For example, the 1-1-th soft program voltage 1-1sVpgm that is higher than the pass voltage Vpass may be applied to the first dummy line DWL1, and then the 1-2-th soft program voltage 1-2sVpgm that is higher than the 1-1-th soft program voltage 1-1sVpgm may be applied thereto. That is, the number of soft program voltages applied to the first dummy line DWL1 at step S47 may be equal to the number of soft program voltages applied to the second and third dummy lines DWL2 and DWL3 at step S45.

Figure 8:
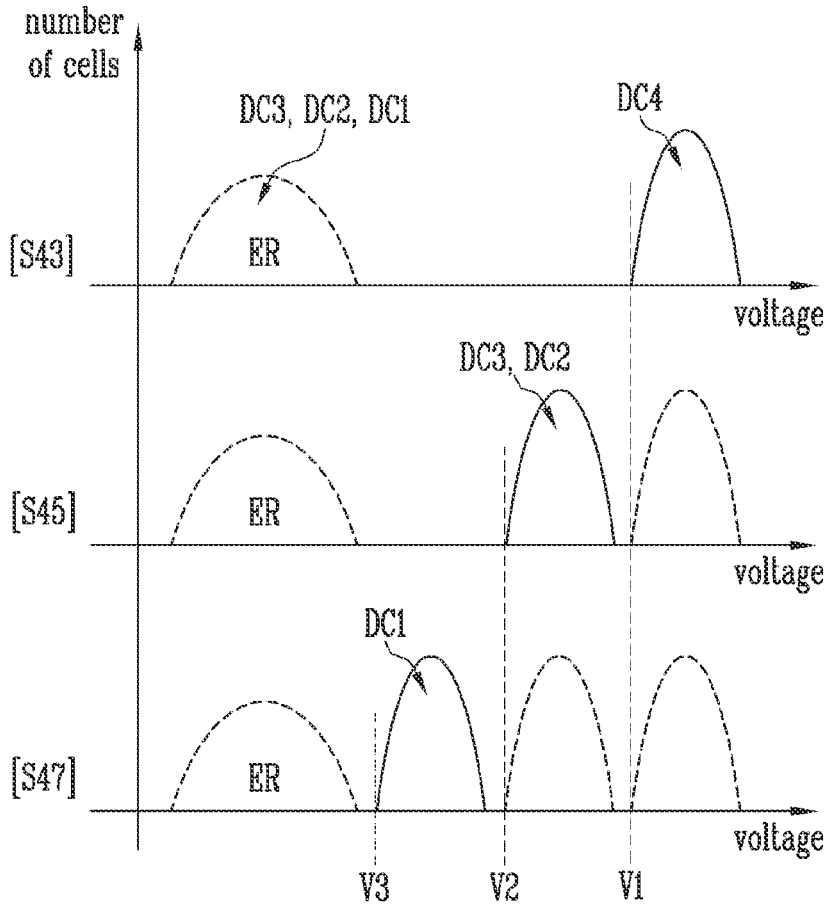
FIG. 8 is a diagram illustrating threshold voltage distributions of dummy cells according to a third embodiment of the present disclosure.

FIG. 8 is a diagram illustrating threshold voltage distributions of dummy cells according to a third embodiment of the present disclosure.

Referring to FIGS. 4 and 8, in the third embodiment, soft program operations may be performed such that, as the dummy cells are closer to an area to which the precharge voltage is applied, the threshold voltages of the dummy cells become lower.

At step S43, the fourth dummy cells DC4 may be programmed to have a threshold voltage of a first voltage V1. Here, the remaining dummy cells, that is, the first to third dummy cells DC1 to DC3 may be maintained in an erase state ER.

At step S45, the second and third dummy cells DC2 and DC3 may be programmed to have a threshold voltage of a second voltage V2 that is lower than the first voltage V1. Here, the first dummy cells DC1 may be maintained in an erase state ER.

At step S47, the first dummy cells DC1 may be programmed to have a threshold voltage of a third voltage V3 that is lower than the second voltage V2. The third voltage V3 may be higher than a threshold voltage in the erase state ER and lower than the second voltage V2.

A program operation according to a third embodiment will be described in detail below.

Figure 9:
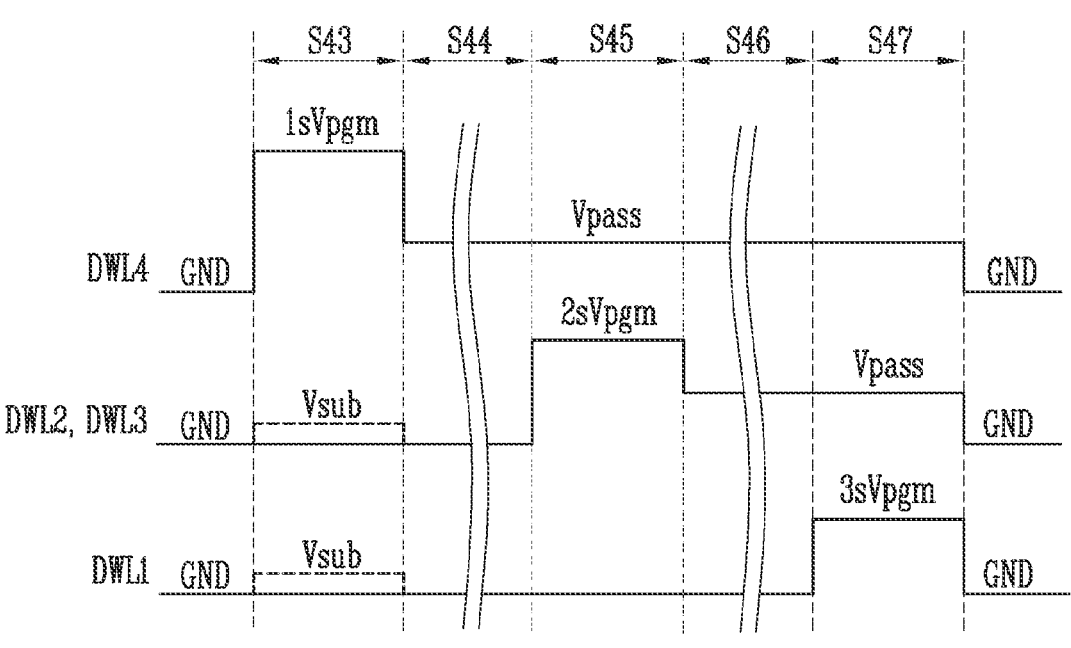
FIG. 9 is a timing diagram illustrating a program operation according to a third embodiment of the present disclosure.

FIG. 9 is a timing diagram illustrating a program operation according to a third embodiment of the present disclosure.

Referring to FIGS. 2 and 9, during a soft program operation performed on dummy cells, a soft program voltage applied to the dummy lines may be set to a lower voltage as the dummy lines are closer to an area to which a precharge voltage is applied. When the precharge voltage is designated to be applied to the source line SL, the fourth dummy line DWL4, among the first to fourth dummy lines DWL1 to DWL4, may be located farthest away from the source line SL, the first dummy line DWL1 may be located closest to the source line SL, and the second and third dummy lines DWL2 and DWL3 may be located at an intermediate distance between the fourth and first dummy lines.

Therefore, during the soft program operation at step S43, a first soft program voltage 1sVpgm, which is the highest voltage, among soft program voltages, may be applied to the fourth dummy line DWL4. At step S43, a ground voltage GND or a positive sub-voltage Vsub may be applied to the first to third dummy lines DWL1 to DWL3 so that the first to third dummy cells DC1 to DC3 are maintained in an erase state.

After step S43 is terminated, step S44 may be performed. Because step S44 is identical to step S44 of FIG. 6A, repeated descriptions thereof will be omitted.

After step S44 is terminated, a soft program operation that programs the second and third dummy cells DC2 and DC3 coupled to the second and third dummy lines DWL2 and DWL3 may be performed at step S45. During the soft program operation at step S45, the second soft program voltage 2sVpgm that is lower than the first soft program voltage 1sVpgm may be applied to the second and third dummy lines DWL2 and DWL3. At step S45, the ground voltage GND may be applied to the first dummy line DWL1 so that the first dummy cells DC1 are maintained in an erase state.

After step S45 is terminated, step S46 may be performed. Because step S46 is identical to step S46 of FIG. 6A, repeated descriptions thereof will be omitted.

After step S46 is terminated, a soft program operation that programs the first dummy cells DC1 coupled to the first dummy line DWL1 may be performed at step S47. During the soft program operation at step S47, the third soft program voltage 3sVpgm that is lower than the second soft program voltage 2sVpgm may be applied to the first dummy line DWL1.

Figure 10:
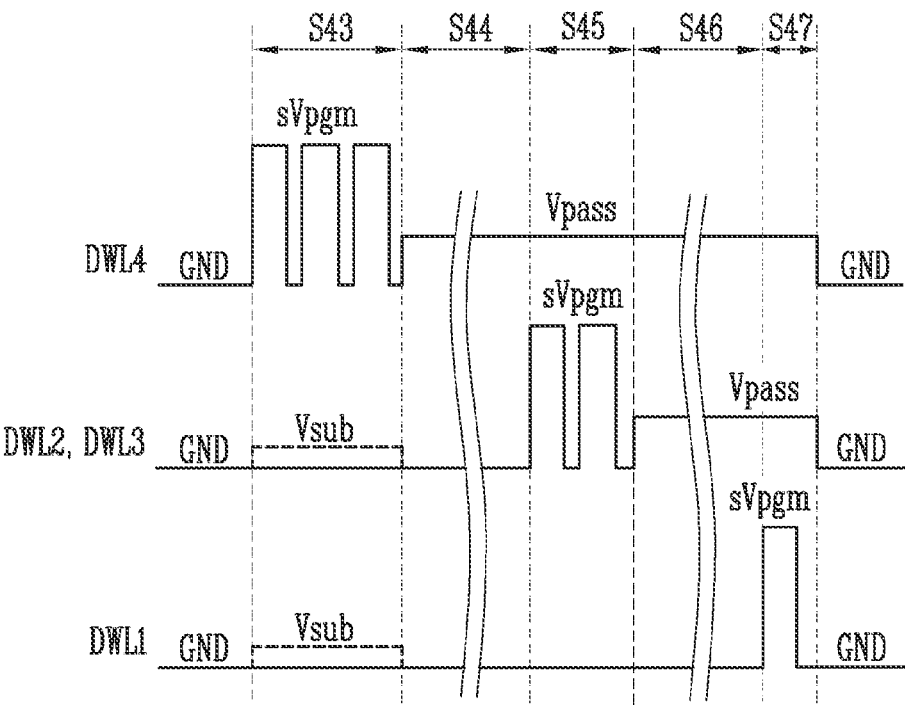
FIG. 10 is a timing diagram illustrating a program operation according to a fourth embodiment of the present disclosure.

FIG. 10 is a timing diagram illustrating a program operation according to a fourth embodiment of the present disclosure.

Referring to FIGS. 2 and 10, during a soft program operation performed on dummy cells, soft program voltages having the same level may be applied multiple times to dummy lines. According to a fourth embodiment, during a soft program operation performed on dummy cells, the soft program operation may be set such that the number of times that the soft program voltage is applied to the dummy lines is reduced as the dummy lines are closer to an area to which a precharge voltage is applied.

When the precharge voltage is designated to be applied to the source line SL, the fourth dummy line DWL4, among the first to fourth dummy lines DWL1 to DWL4, may be located farthest away from the source line SL, and thus, the number of times that the soft program voltage is applied to the fourth dummy line DWL4 may be the highest. Because the first dummy line DWL1 is located closest to the source line SL, the number of times that the soft program voltage is applied to the first dummy line DWL1 may be the lowest.

For example, during the soft program operation performed to program the fourth dummy cells DC4 at step S43, a soft program voltage sVpgm may be applied multiple times to the fourth dummy line DWL4. The levels of the soft program voltages sVpgm applied to the fourth dummy line DWL4 may be equal to each other. At step S43, a ground voltage GND or a positive sub-voltage Vsub may be applied to the first to third dummy lines DWL1 to DWL3 so that the first to third dummy cells DC1 to DC3 are maintained in an erase state.

After step S43 is terminated, step S44 may be performed. Because step S44 is identical to step S44 of FIG. 6A, repeated descriptions thereof will be omitted.

After step S44 is terminated, the soft program voltage sVpgm may be applied multiple times to the second and third dummy lines DWL2 and DWL3 at step S45. The number of times that the soft program voltage sVpgm is applied to the second and third dummy lines DWL2 and DWL3 at step S45 may be less than the number of times that the soft program voltage sVpgm is applied to the fourth dummy line DW4 at step S43. For example, when the soft program voltage sVpgm is applied three times to the fourth dummy line DWL4 at step S43, the soft program voltage sVpgm may be applied twice to the second and third dummy lines DWL2 and DWL3 at step S45. At step S45, the pass voltage Vpass may be applied to the fourth dummy line DWL4, and the ground voltage GND may be applied to the first dummy line DWL1 so that the first dummy cells DC1 are maintained in an erase state.

After step S45 is terminated, step S46 may be performed. Because step S46 is identical to step S46 of FIG. 6A, repeated descriptions thereof will be omitted.

After step S46 is terminated, the soft program voltage sVpgm may be applied to the first dummy line DWL1 at step S47. Although the soft program voltage sVpgm is illustrated as being applied once to the first dummy line DWL1, the number of times that the soft program voltage sVpgm is applied to the first dummy line DWL1 at step S47 may be 2 or more when the number of times that the soft program voltage sVpgm is applied to the second and third dummy lines DWL2 and DWL3 is 3 or more at step S45.

Figure 11:
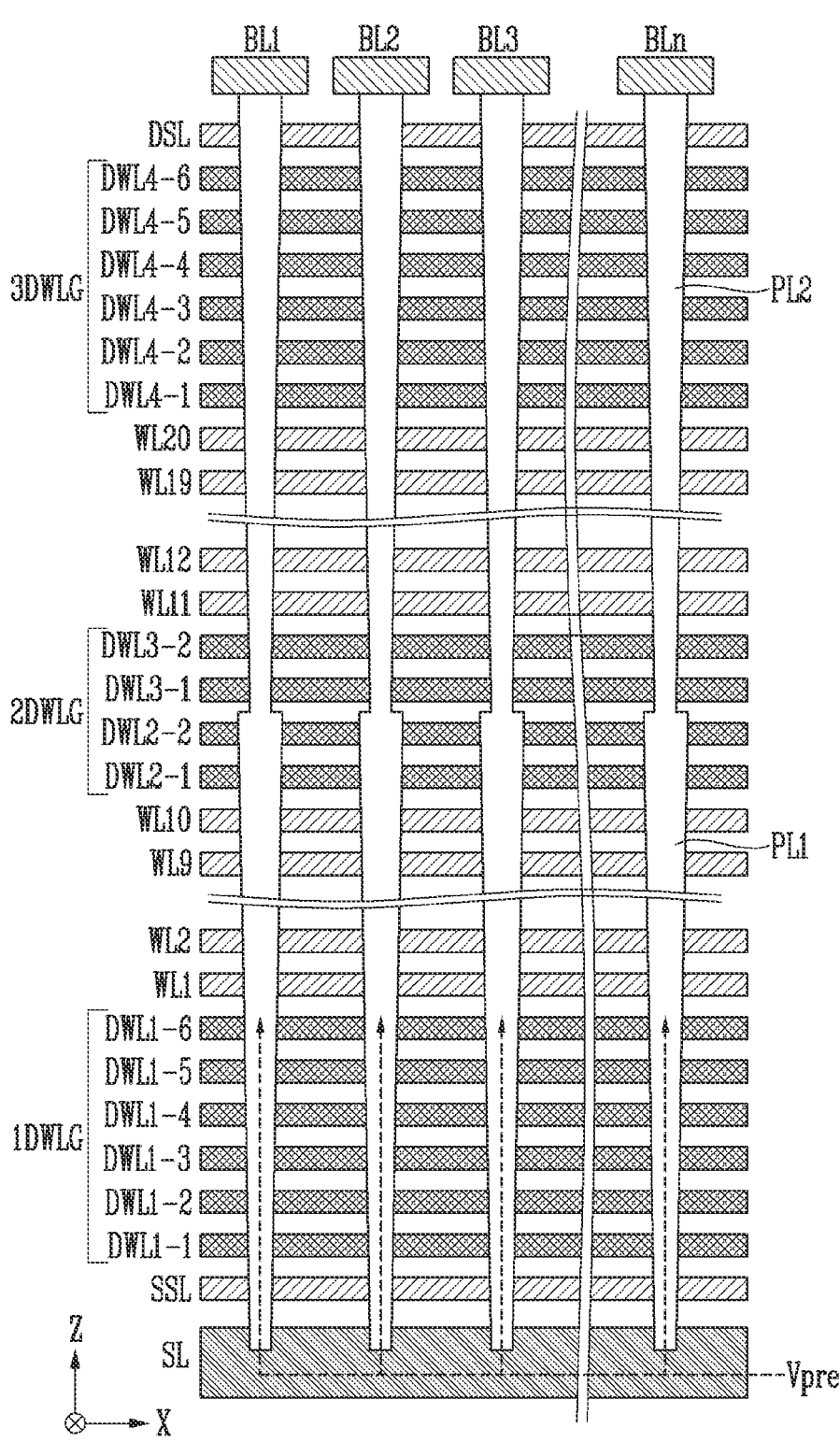
FIG. 11 is a sectional view of a memory block for explaining a fifth embodiment of the present disclosure.

FIG. 11 is a sectional view of a memory block for explaining a fifth embodiment of the present disclosure.

Referring to FIG. 11, a plurality of dummy lines may be formed in each of the areas in which first to fourth dummy lines (e.g., DWL1 to DWL4 of FIG. 3) have been formed. For example, 1-1-th to 1-6-th dummy lines DWL1-1 to DWL1-6 may be formed between a source line SL and a first word line WL1, 2-1-th, 2-2-th, 3-1-th, and 3-2-th dummy lines DWL2-1, DWL2-2, DWL3-1, and DWL3-2 may be formed between tenth and eleventh word lines WL10 and WL11, and 4-1-th to 4-6-th dummy lines DWL4-1 to DWL4-6 may be formed between a twentieth word line WL20 and a drain select line DSL. Because the memory block for explaining a program operation according to the fifth embodiment is illustrated in FIG. 11, the number of dummy lines formed in each area may vary based on the memory block.

The 1-1-th to 1-6-th dummy lines DWL1-1 to DWL1-6 may be included in a first dummy line group 1DWLG, the 2-1-th, 2-2-th, 3-1-th, and 3-2-th dummy lines DWL2-1, DWL2-2, DWL3-1, and DWL3-2 may be included in a second dummy line group 2DWLG, and 4-1-th to 4-6-th dummy lines DWL4-1 to DWL4-6 may be included in a third dummy line group 3DWLG.

Because the structure of the memory block, except for the first to third dummy line groups 1DWLG to 3DWLG, is identical to that of the memory block illustrated in FIG. 3, detailed descriptions thereof will be omitted.

FIG. 12 is a flowchart illustrating a program operation according to a fifth embodiment of the present disclosure.

Referring to FIGS. 11 and 12, when an erase operation is performed on the memory block at step S121, a selection program operation may be performed on the selection transistors at step S122. For example, the selection program operation may be performed to increase the threshold voltages of source selection transistors and drain selection transistors, which are decreased by the erase operation, up to a target select voltage.

When the threshold voltages of the selection transistors are increased up to the target select voltage, a soft program operation may be performed on the dummy cells coupled to the third dummy line group 3DWLG at step S123. For example, the soft program operation may be performed such that the threshold voltages of dummy cells coupled to the third dummy line group 3DWLG become higher than threshold voltages in an erase state. When the soft program operation is performed on the dummy cells coupled to the third dummy line group 3DWLG at step S123, the dummy cells coupled to the remaining word line groups, that is, the second and third dummy line groups 2DWLG and 3DWLG, may be maintained in an erase state.

When the soft program operation on the dummy cells coupled to the third dummy line group 3DWLG is terminated, a normal program operation may be performed on the memory cells included in the second plugs PL2 at step S124. During the normal program operation on the memory cells included in the second plugs PL2, a positive precharge voltage Vpre may be applied through the source line SL to increase the channel voltages of the unselected strings. The normal program operation on memory cells included in the second plugs PL2 may be performed from the twentieth word line WL20 to the eleventh word line WL11.

When the normal program operation on the memory cells included in the second plugs PL2 is terminated, a soft program operation may be performed on dummy cells coupled to the second dummy line group 2DWLG at step S125. The dummy cells coupled to the second dummy line group 2DWLG may be programmed to have threshold 20 voltages that are lower than the threshold voltages of dummy cells coupled to the third dummy line group 3DWLG. When the soft program operation is performed on the dummy cells coupled to the second dummy line group 2DWLG, the dummy cells coupled to the first dummy line group 1DWLG may be maintained in an erase state.

When the soft program operation on the dummy cells coupled to the second dummy line group 2DWLG is terminated, a normal program operation may be performed on memory cells included in first plugs PL1 at step S126. During the normal program operation on the memory cells included in the first plugs PL1, the positive precharge voltage Vpre may be applied through the source line SL to increase the channel voltages of the unselected strings. The normal program operation on the memory cells included in the first plugs PL1 may be performed from the tenth word line WL10 to the first word line WL1.

When the normal program operation on the memory cells included in the first plugs PL1 is terminated, a soft program operation may be performed on dummy cells coupled to the first dummy line group 1DWLG at step S127. The dummy cells coupled to the first dummy line group 1DWLG may be programmed to have threshold voltages equal to the threshold voltages of dummy cells coupled to the second dummy line group 2DWLG.

Figure 13:
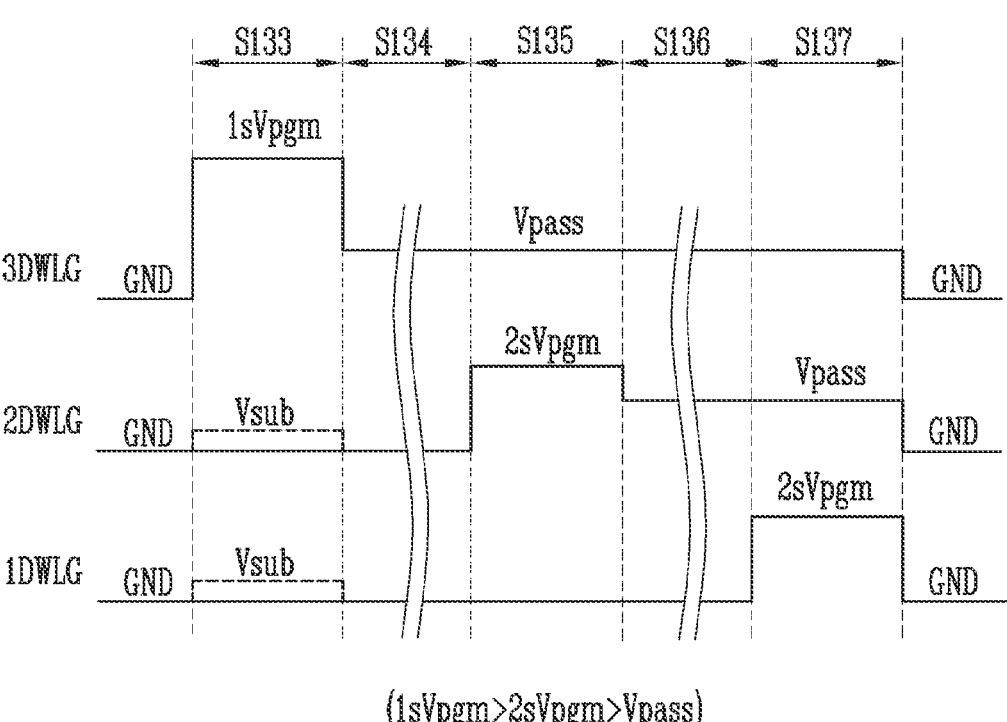
FIG. 13 is a timing diagram illustrating a program operation according to a fifth embodiment of the present disclosure.

FIG. 13 is a timing diagram illustrating a program operation according to a fifth embodiment of the present disclosure.

Referring to FIGS. 11 to 13, when the program operation on the memory block begins, a soft program operation may be performed on dummy cells coupled to the third dummy line group 3DWLG located farthest away from the source line SL, among the first to third dummy line groups 1DWLG to 3DWLG. During a soft program operation, a first soft program voltage 1sVpgm may be applied to the third dummy line group 3DWLG at step S133. In this case, a ground voltage GND or a positive sub-voltage Vsub may be applied to the first and second dummy line groups 1DWLG and 2DWLG. Here, the sub-voltage Vsub may be set to a low positive voltage so that the dummy cells coupled to first and second dummy line groups 1DWLG and 2DWLG are not changed to a program state. For example, the sub-voltage Vsub may be set to a value between 0 V and 1 V. The ground voltage GND may be 0 V.

After step S133 is terminated, a normal program operation may be performed on memory cells included in a second plug PL2 at step S134. The normal program operation may be performed by using the method described above with reference to FIGS. 5 and 6A. While the normal program operation is being performed on the memory cells included in the second plug PL2, a pass voltage Vpass for turning on dummy cells may be applied to the third dummy line group 3DWLG.

After step S134 is terminated, a soft program operation may be performed on dummy cells coupled to the second dummy line group 2DWLG at step S135. During the soft program operation, a second soft program voltage 2sVpgm that is lower than the first soft program voltage 1sVpgm may be applied to the second dummy line group 2DWLG. Here, the ground voltage GND may be applied to the first dummy line group 1DWLG, and the pass voltage Vpass may be applied to the third dummy line group 3DWLG. Because the pass voltage Vpass is a voltage for turning on dummy cells, it may be set to a positive voltage, and the second soft program voltage 2sVpgm may be set to a voltage that is higher than the pass voltage Vpass. Because the second soft program voltage 2sVpgm that is lower than the first soft program voltage 1sVpgm is applied to the second dummy line group 2DWLG, the dummy cells coupled to the second dummy line group 2DWLG may have threshold voltages that are lower than those of the dummy cells coupled to the third dummy line group 3DWLG.

After step S135 is terminated, a normal program operation may be performed on memory cells included in the first plug PL1 at step S136. The normal program operation may be performed by using the method described above with reference to FIGS. 5 and 6A. While the normal program operation is being performed on the memory cells included in the first plug PL1, the pass voltage Vpass for turning on dummy cells may be applied to the second and third dummy line groups 2DWLG and 3DWLG.

After step S136 is terminated, a soft program operation may be performed on dummy cells coupled to the first dummy line group 1DWLG at step S137. During the soft program operation, the second soft program voltage 2sVpgm may be applied to the first dummy line group 1DWLG. In this case, the pass voltage Vpass may be applied to the second and third dummy line groups 2DWLG and 3DWLG. Because the pass voltage Vpass is a voltage for turning on dummy cells, it may be set to a positive voltage, and the second soft program voltage 2sVpgm may be set to a voltage that is higher than the pass voltage Vpass. Because the second soft program voltage 2sVpgm is applied to the first dummy line group 1DWLG, the dummy cells coupled to the first dummy line group 1DWLG may have threshold voltages equal to those of the dummy cells coupled to the second dummy line group 2DWLG.

Figure 14:
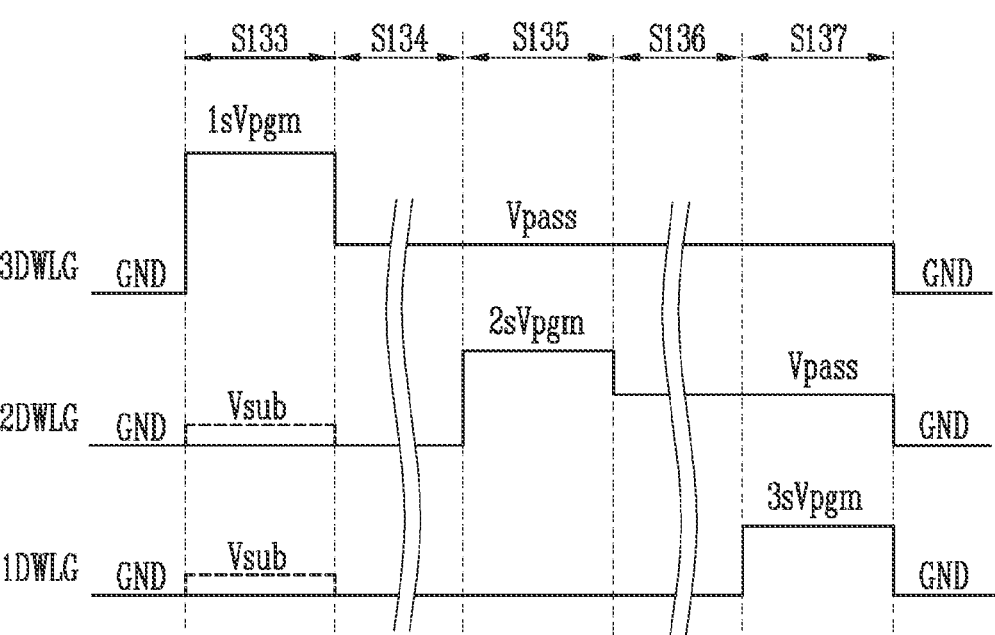
FIG. 14 is a timing diagram illustrating a program operation according to a sixth embodiment of the present disclosure.

FIG. 14 is a timing diagram illustrating a program operation according to a sixth embodiment of the present disclosure.

Referring to FIGS. 11, 12, and 14, when the program operation on the memory block begins, a soft program operation may be performed on dummy cells coupled to the third dummy line group 3DWLG located farthest away from the source line SL, among the first to third dummy line groups 1DWLG to 3DWLG. During a soft program operation, a first soft program voltage 1sVpgm may be applied to the third dummy line group 3DWLG at step S133. In this case, a ground voltage GND or a positive sub-voltage Vsub may be applied to the first and second dummy line groups 1DWLG and 2DWLG. Here, the sub-voltage Vsub may be set to a low positive voltage so that the dummy cells coupled to first and second dummy line groups 1DWLG and 2DWLG are not changed to a program state. For example, the sub-voltage Vsub may be set to a value between 0 V and 1 V. The ground voltage GND may be 0 V.

After step S133 is terminated, a normal program operation may be performed on memory cells included in the second plug PL2 at step S134. The normal program operation may be performed by using the method described above with reference to FIGS. 5 and 6A. While the normal program operation is being performed on the memory cells included in the second plug PL2, a pass voltage Vpass for turning on dummy cells may be applied to the third dummy line group 3DWLG.

After step S134 is terminated, a soft program operation may be performed on dummy cells coupled to the second dummy line group 2DWLG at step S135. During the soft program operation, a second soft program voltage 2sVpgm that is lower than the first soft program voltage 1sVpgm may be applied to the second dummy line group 2DWLG. Here, the ground voltage GND may be applied to the first dummy line group 1DWLG, and the pass voltage Vpass may be applied to the third dummy line group 3DWLG. Because the pass voltage Vpass is a voltage for turning on dummy cells, it may be set to a positive voltage, and the second soft program voltage 2sVpgm may be set to a voltage that is higher than the pass voltage Vpass. Because the second soft program voltage 2sVpgm that is lower than the first soft program voltage 1sVpgm is applied to the second dummy line group 2DWLG, the dummy cells coupled to the second dummy line group 2DWLG may have threshold voltages that are lower than those of the dummy cells coupled to the third dummy line group 3DWLG.

After step S135 is terminated, a normal program operation may be performed on memory cells included in the first plug PL1 at step S136. The normal program operation may be performed by using the method described above with reference to FIGS. 5 and 6A. While the normal program operation is being performed on the memory cells included in the first plug PL1, the pass voltage Vpass for turning on dummy cells may be applied to the second and third dummy line groups 2DWLG and 3DWLG.

After step S136 is terminated, a soft program operation may be performed on dummy cells coupled to the first dummy line group 1DWLG at step S137. During the soft program operation, a third soft program voltage 3sVpgm that is lower than the second soft program voltage 2sVpgm may be applied to the first dummy line group 1DWLG. In this case, the pass voltage Vpass may be applied to the second and third dummy line groups 2DWLG and 3DWLG. Because the pass voltage Vpass is a voltage for turning on dummy cells, it may be set to a positive voltage, and the third soft program voltage 3sVpgm may be set to a voltage that is higher than the pass voltage Vpass. Because the third soft program voltage 3sVpgm that is lower than the second soft program voltage 2sVpgm is applied to the first dummy line group 1DWLG, the dummy cells coupled to the first dummy line group 1DWLG may have threshold voltages that are lower than those of the dummy cells coupled to the second dummy line group 2DWLG.

Figure 15:
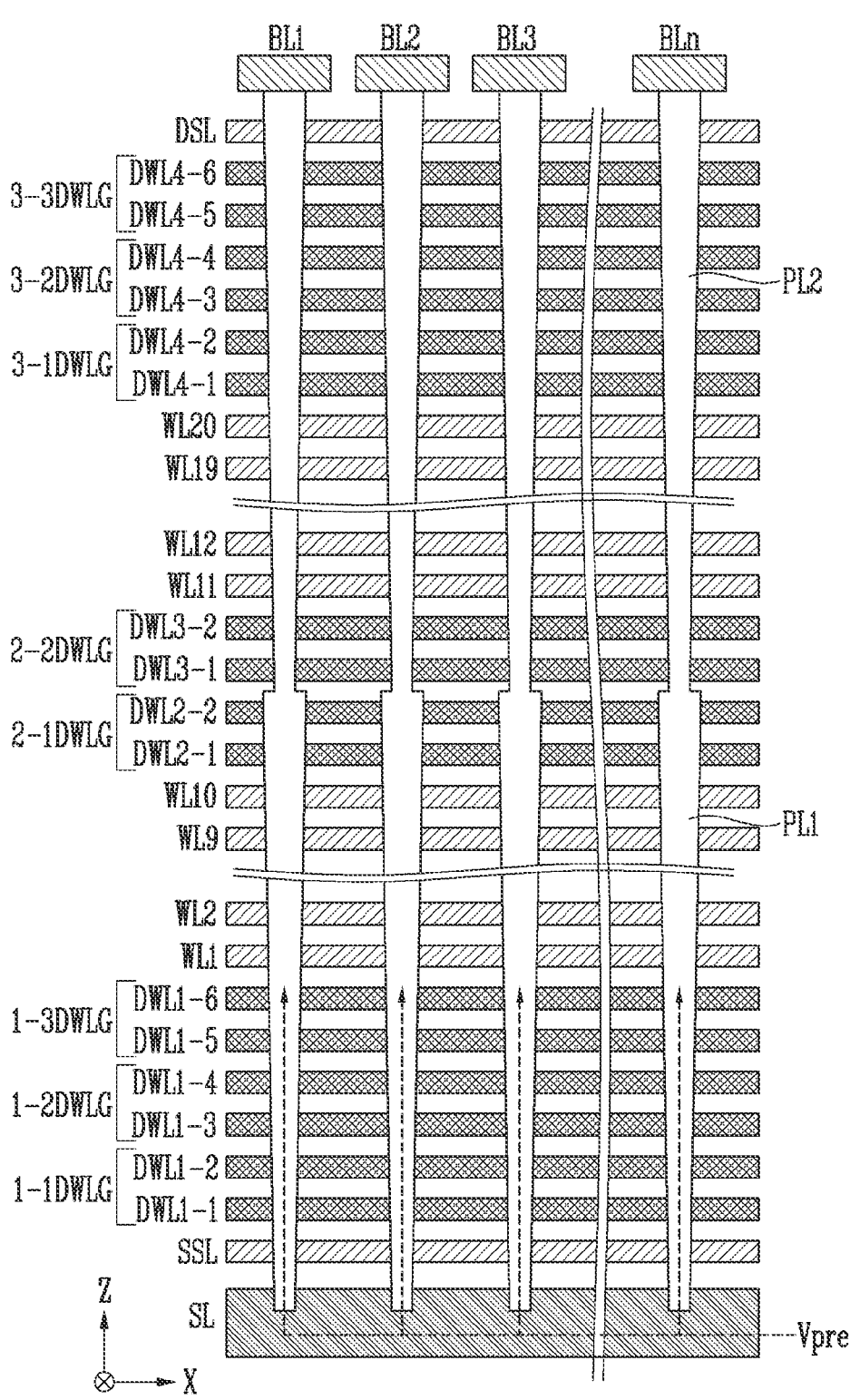
FIG. 15 is a sectional view of a memory block for explaining a seventh embodiment of the present disclosure.

FIG. 15 is a sectional view of a memory block for explaining a seventh embodiment of the present disclosure.

Referring to FIG. 15, the structure of the memory block may be identical to that of the memory block illustrated in FIG. 11, but each of the first to third dummy line groups 1DWLG to 3DWLG, illustrated in FIG. 11, may be divided into a plurality of groups.

The 1-1-th to 1-6-th dummy lines DWL1-1 to DWL1-6 may be divided into 1-1-th, 1-2-th, and 1-3-th dummy line groups 1-1DWLG, 1-2DWLG, and 1-3DWLG. The 1-1-th dummy line group 1-1DWLG may include 1-1-th and 1-2-th dummy lines DWL1-1 and DWL1-2. The 1-2-th dummy line group 1-2DWLG may include 1-3-th and 1-4-th dummy lines DWL1-3 and DWL1-4. The 1-3-th dummy line group 1-3DWLG may include 1-5-th and 1-6-th dummy lines DWL1-5 and DWL1-6.

2-1-th and 2-2-th dummy lines DWL2-1 and DWL2-2 may be included in a 2-1-th dummy line group 2-1DWLG, and 3-1-th and 3-2-th dummy lines DWL3-1 and DWL3-2 may be included in a 2-2-th dummy line group 2-2DWLG.

4-1-th to 4-6-th dummy lines DWL4-1 to DWL4-6 may be divided into 3-1-th, 3-2-th, and 3-3-th dummy line groups 3-1DWLG, 3-2DWLG, and 3-3DWLG. The 3-1-th dummy line group 3-1DWLG may include 4-1-th and 4-2-th dummy lines DWL4-1 and DWL4-2. The 3-2-th dummy line group 3-2DWLG may include 4-3-th and 4-4-th dummy lines DWL4-3 and DWL4-4. The 3-3-th dummy line group 3-3DWLG may include 4-5-th and 4-6-th dummy lines DWL4-5 and DWL4-6.

Figure 16:
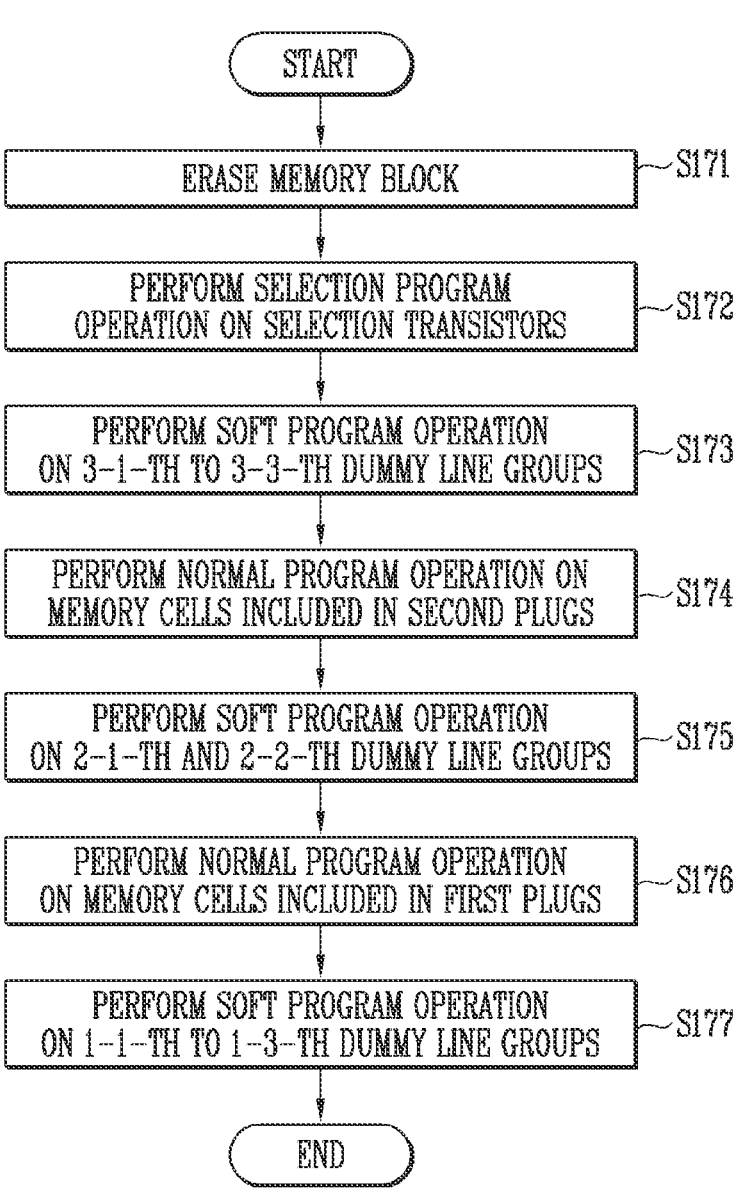
FIG. 16 is a flowchart illustrating a program operation according to a seventh embodiment of the present disclosure.

FIG. 16 is a flowchart illustrating a program operation according to a seventh embodiment of the present disclosure.

Referring to FIGS. 15 and 16, when an erase operation is performed on the memory block at step S171, a selection program operation may be performed on selection transistors at step S172. For example, the selection program operation may be performed to increase the threshold voltages of source selection transistors and drain selection transistors, which are decreased by the erase operation, up to a target select voltage.

When the threshold voltages of the selection transistors are increased up to the target select voltage, a soft program operation may be performed on the dummy cells coupled to the 3-1-th to 3-3-th dummy line groups 3-1DWLG to 3-3DWLG at step S173. For example, the soft program operation may be simultaneously performed on dummy cells coupled to the 3-1-th to 3-3-th dummy line groups 3-1DWLG to 3-3DWLG or may be sequentially performed from the 3-3-th dummy line group 3-3DWLG to the 3-1-th dummy line group 3-1DWLG. The dummy cells coupled to the 3-3-th dummy line group 3-3DWLG, among the dummy cells coupled to the 3-1-th to 3-3-th dummy line groups 3-1DWLG to 3-3DWLG, may be programmed to have the highest threshold voltage, and the dummy cells coupled to the 3-1-th dummy line group 3-1DWLG may be programmed to have the lowest threshold voltage. That is, the dummy cells coupled to the 3-1-th to 3-3-th dummy line groups 3-1DWLG to 3-3DWLG may be programmed to have lower threshold voltages as the dummy cells are closer to the source line SL. When the soft program operation is performed on the dummy cells coupled to the 3-1-th to 3-3-th dummy line groups 3-1DWLG to 3-3DWLG at step S173, the dummy cells coupled to the remaining dummy line groups, that is, the 1-1-th to 1-3-th dummy line groups 1-1DWLG to 1-3DWLG and the 2-1-th and 2-2-th dummy line groups 2-1DWLG and 2-2DWLG, may be maintained in an erase state.

When the soft program operation on the dummy cells coupled to the 3-1-th to 3-3-th dummy line groups 3-1DWLG to 3-3DWLG is terminated, a normal program operation may be performed on memory cells included in second plugs PL2 at step S174. During the normal program operation on the memory cells included in the second plugs PL2, a positive precharge voltage Vpre may be applied through the source line SL to increase the channel voltages of the unselected strings. The normal program operation on memory cells included in the second plugs PL2 may be performed from the twentieth word line WL20 to the eleventh word line WL11.

When the normal program operation performed on the memory cells included in the second plugs PL2 is terminated, a soft program operation may be performed on dummy cells coupled to the 2-1-th and 2-2-th dummy line groups 2-1DWLG and 2-2DWLG at step S175. The dummy cells coupled to the 2-1-th and 2-2-th dummy line groups 2-1DWLG and 2-2DWLG may be programmed to have threshold voltages that are lower than those of the dummy cells coupled to the 3-1-th dummy line group 3-1DWLG. Among the dummy cells coupled to the 2-1-th and 2-2-th dummy line groups 2-1DWLG and 2-2DWLG, the dummy cells coupled to the 2-1-th dummy line group 2-1DWLG may be programmed to have threshold voltages that are lower than those of the dummy cells coupled to the 2-2-th dummy line group 2-2DWLG. When the soft program operation is performed on the dummy cells coupled to the 2-1-th and 2-2-th dummy line groups 2-1DWLG and 2-2DWLG, the dummy cells coupled to the 1-1-th to 1-3-th dummy line groups 1-1DWLG to 1-3DWLG may be maintained in an erase state.

When the soft program operation on the dummy cells coupled to the 2-1-th dummy line group 2-1DWLG is terminated, a normal program operation may be performed on memory cells included in first plugs PL1 at step S176. During the normal program operation on the memory cells included in the first plugs PL1, the positive precharge voltage Vpre may be applied through the source line SL to increase the channel voltages of the unselected strings. The normal program operation on the memory cells included in the first plugs PL1 may be performed from the tenth word line WL10 to the first word line WL1.

When the normal program operation on the memory cells included in the first plugs PL1 is terminated, a soft program operation may be performed on dummy cells coupled to the 1-1-th to 1-3-th dummy line groups 1-1DWLG to 1-3DWLG at step S177. The dummy cells coupled to the first dummy line group 1DWLG may be programmed to have threshold voltages that are equal to those of the dummy cells coupled to the second dummy line group 2DWLG. For example, the soft program operation may be simultaneously performed on dummy cells coupled to the 1-1-th to 1-3-th dummy line groups 1-1DWLG to 1-3DWLG or may be sequentially performed from the 1-3-th dummy line group 1-3DWLG to the 1-1-th dummy line group 1-1DWLG. The dummy cells coupled to the 1-1-th to 1-3-th dummy line groups 1-1DWLG to 1-3DWLG may be programmed to have threshold voltages that are lower than or equal to those of the dummy cells coupled to the 2-1-th and 2-2-th dummy line groups 2-1DWLG and 2-2DWLG. The dummy cells coupled to the 1-3-th dummy line group 1-3DWLG, among the dummy cells coupled to the 1-1-th to 1-3-th dummy line groups 1-1DWLG to 1-3DWLG, may be programmed to have the highest threshold voltage, and the dummy cells coupled to the 1-1-th dummy line group 1-1DWLG may be programmed to have the lowest threshold voltage. That is, the dummy cells coupled to the 1-1-th to 1-3-th dummy line groups 1-1DWLG to 1-3DWLG may be programmed to have lower threshold voltages as the dummy cells are closer to the source line SL.

Figure 17:
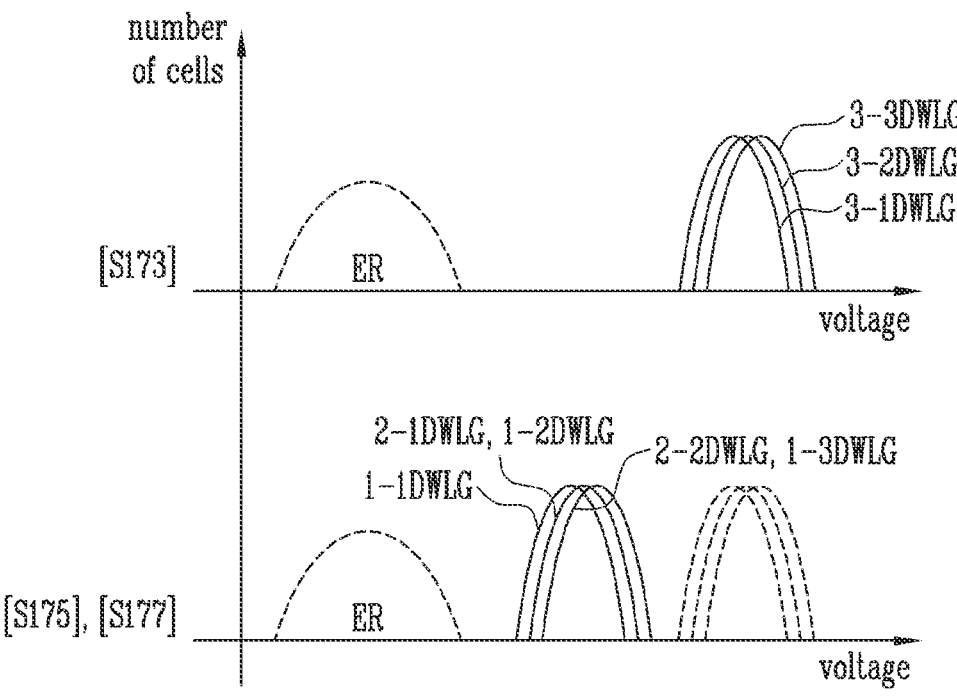
FIG. 17 is a diagram illustrating threshold voltage distributions of dummy cells according to a seventh embodiment of the present disclosure.

FIG. 17 is a diagram illustrating threshold voltage distributions of dummy cells according to a seventh embodiment of the present disclosure.

Referring to FIGS. 15 to 17, during the soft program operation performed at step S173, dummy cells coupled to 3-1-th to 3-3-th dummy line groups 3-1DWLG to 3-3DWLG may be simultaneously programmed, but the threshold voltages thereof may be different from each other. For example, among the dummy cells coupled to the 3-1-th to 3-3-th dummy line groups 3-1DWLG to 3-3DWLG, the dummy cells coupled to the 3-3-th dummy line group 3-3DWLG may be programmed to have the highest threshold voltage, and the dummy cells coupled to the 3-1-th dummy line group 3-1DWLG may be programmed to have the lowest threshold voltage. That is, the soft program operation may be performed such that the threshold voltages of dummy cells that are closer to the source line SL to which the precharge voltage Vpre is applied, among the dummy cells coupled to the 3-1-th to 3-3-th dummy line groups 3-1DWLG to 3-3DWLG, are relatively low.

By the soft program operation performed at step S175 or S177, the threshold voltages of the dummy cells coupled to the 2-1-th, 2-2-th, and 1-1-th to 1-3-th dummy line groups 2-1DWLG, 2-2DWG, and 1-1DWLG to 1-3DWLG may be higher than threshold voltages in the erase state ER but may be lower than the threshold voltages of the dummy cells coupled to the 3-1-th to 3-3-th dummy line groups 3-1DWLG to 3-3DWLG. For example, among the dummy cells coupled to the 2-1-th, 2-2-th, and 1-1-th to 1-3-th dummy line groups 2-1DWLG, 2-2DWG, and 1-1DWLG to 1-3DWLG, the dummy cells coupled to the 2-2-th and 1-3-th dummy line groups 2-2DWLG and 1-3DWLG may be programmed to have the highest threshold voltage, and the dummy cells coupled to the 1-1-th dummy line group 1-1DWLG may be programmed to have the lowest threshold voltage.

Figure 18:
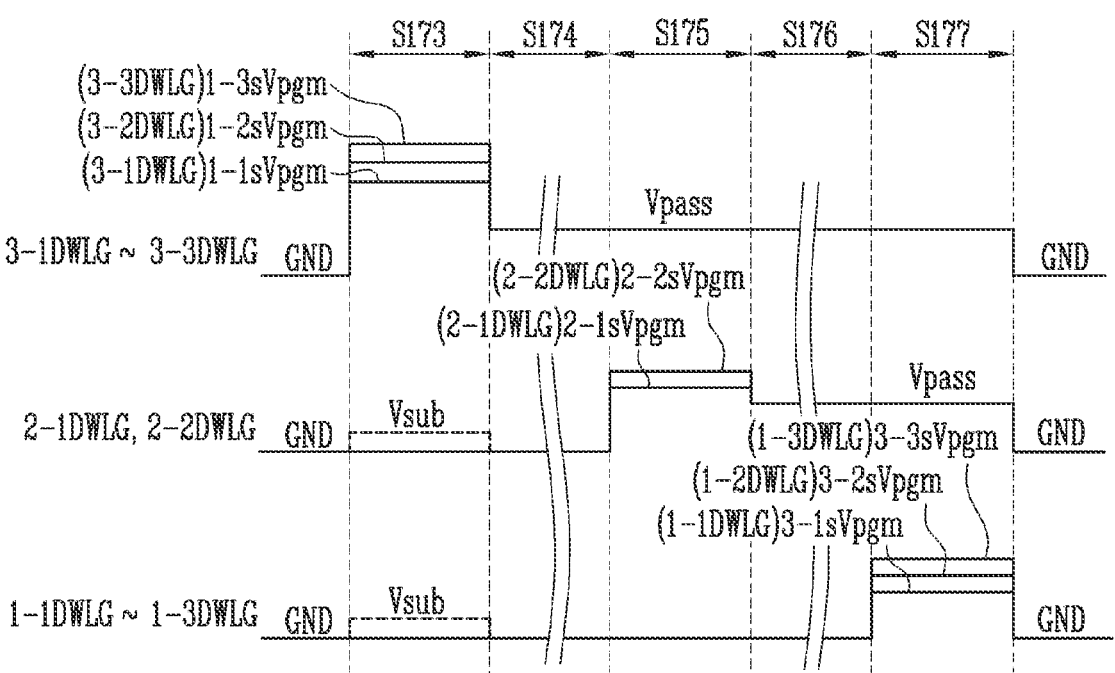
FIG. 18 is a timing diagram illustrating a program operation according to a seventh embodiment of the present disclosure.

FIG. 18 is a timing diagram illustrating a program operation according to a seventh embodiment of the present disclosure.

Referring to FIGS. 15, 16, and 18, when the program operation on the memory block begins, a soft program operation may be performed on dummy cells coupled to 3-1-th to 3-3-th dummy line groups 3-1DWLG to 3-3DWLG located relatively far away from the source line SL, among the 1-1-th to 3-3-th dummy line groups 1-1DWLG to 3-3DWLG, at step S173. During the soft program operation performed at step S173, a 1-1-th soft program voltage 1-1sVpgm may be applied to the 3-1-th dummy line group 3-1DWLG, a 1-2-th soft program voltage 1-2sVpgm may be applied to the 3-2-th dummy line group 3-2DWLG, and a 1-3-th soft program voltage 1-3sVpgm may be applied to the 3-3-th dummy line group 3-3DWLG. Because, among the 3-1-th to 3-3-th dummy line groups 3-1DWLG to 3-3DWLG, the 3-1-th dummy line group 3-1DWLG is closest to the source line SL, the 1-1-th soft program voltage 1-1sVpgm, which is the lowest program voltage among the 1-1-th to 1-3-th soft program voltages 1-1sVpgm to 1-3sVpgm, may be applied to the 3-1-th dummy line group 3-1DWLG. Because, among the 3-1-th to 3-3-th dummy line groups 3-1DWLG to 3-3DWLG, the 3-3-th dummy line group 3-3DWLG is located farthest away from the source line SL, the 1-3-th soft program voltage 1-3sVpgm, which is the highest program voltage among the 1-1-th to 1-3-th soft program voltages 1-1sVpgm to 1-3sVpgm, may be applied to the 3-3-th dummy line group 3-3DWLG. In this case, the ground voltage GND or positive sub-voltage Vsub may be applied to the 1-1-th to 1-3-th, 2-1-th, and 2-2-th dummy line groups 1-1DWLG to 1-3DWLG, 2-1DWLG, and 2-2DWLG. Here, the sub-voltage Vsub may be set to a low positive voltage so that the dummy cells coupled to the 1-1-th to 1-3-th, 2-1-th, and 2-2-th dummy line groups 1-1DWLG to 1-3DWLG, 2-1DWLG, and 2-2DWLG are not changed to a program state. For example, the sub-voltage Vsub may be set to a value between 0 V and 1 V. The ground voltage GND may be 0 V.

After step S173 is terminated, a normal program operation may be performed on memory cells included in the second plug PL2 at step S174. The normal program operation may be performed by using the method described above with reference to FIGS. 5 and 6A. While the normal program operation is being performed on the memory cells included in the second plug PL2, the pass voltage Vpass for turning on dummy cells may be applied to the 3-1-th to 3-3-th dummy line groups 3-1DWLG to 3-3DWLG.

After step S174 is terminated, a soft program operation may be performed on the dummy cells coupled to the 2-1-th and 2-2-th dummy line groups 2-1DWLG and 2-2DWLG at step S175. During the soft program operation, a 2-1-th soft program voltage 2-1sVpgm may be applied to the 2-1-th dummy line group 2-1DWLG, and a 2-2-th soft program voltage 2-2sVpgm may be applied to the 2-2-th dummy line group 2-2DWLG. Because, among the 2-1-th and 2-2-th dummy line groups 2-1DWLG and 2-2DWLG, the 2-1-th dummy line group 2-1DWLG is relatively close to the source line SL, the 2-1-th soft program voltage 2-1sVpgm, which is a lower voltage of the 2-1-th and 2-2-th soft program voltages 2-1sVpgm and 2-2sVpgm, may be applied to the 2-1-th dummy line group 2-1DWLG. Because the 2-2-th dummy line group 2-2DWLG is located farther away from the source line SL, the 2-2-th soft program voltage 2-2sVpgm that is higher than the 2-1-th soft program voltage 2-1sVpgm may be applied to the 2-2-th dummy line group 2-2DWLG. In this case, the pass voltage Vpass may be applied to the 3-1-th to 3-3-th dummy line groups 3-1DWLG to 3-3DWLG, and the ground voltage GND may be applied to the 1-1-th to 1-3-th dummy line groups 1-1DWLG to 1-3DWLG.

After step S175 is terminated, a normal program operation may be performed on memory cells included in the first plug PL1 at step S176. The normal program operation may be performed by using the method described above with reference to FIGS. 5 and 6A. While the normal program operation is being performed on the memory cells included in the first plug PL1, the pass voltage Vpass for turning on dummy cells may be applied to the 2-1-th, 2-2-th, and 3-1-th to 3-3-th dummy line groups 2-1DWLG, 2-2DWLG, and 3-1DWLG to 3-3DWLG, and the ground voltage GND may be applied to the 1-1-th to 1-3-th dummy line groups 1-1DWLG to 1-3DWLG.

After step S176 is terminated, a soft program operation may be performed on the dummy cells coupled to the 1-1-th to 1-3-th dummy line groups 1-1DWLG to 1-3DWLG at step S177. During the soft program operation performed at step S177, a 3-1-th soft program voltage 3-1sVpgm may be applied to the 1-1-th dummy line group 1-1DWLG, a 3-2-th soft program voltage 3-2sVpgm may be applied to the 1-2-th dummy line group 1-2DWLG, and a 3-3-th soft program voltage 3-3sVpgm may be applied to the 1-3-th dummy line group 1-3DWLG. Because, among the 1-1-th to 1-3-th dummy line groups 1-1DWLG to 1-3DWLG, the 1-1-th dummy line group 1-1DWLG is closest to the source line SL, the 3-1-th soft program voltage 3-1sVpgm, which is the lowest program voltage of the 3-1-th to 3-3-th soft program voltages 3-1sVpgm to 3-3sVpgm, may be applied to the 1-1-th dummy line group 1-1DWLG. Because, among the 1-1-th to 1-3-th dummy line groups 1-1DWLG to 1-3DWLG, the 1-3-th dummy line group 1-3DWLG is located farthest away from the source line SL, the 3-3-th soft program voltage 3-3sVpgm, which is the highest program voltage of the 3-1-th to 3-3-th soft program voltages 3-1sVpgm to 3-3sVpgm, may be applied to the 1-3-th dummy line group 1-3DWLG. Here, the pass voltage Vpass may be applied to the 2-1-th, 2-2-th, and 3-1-th to 3-3-th dummy line groups 2-1DWLG, 2-2DWLG, and 3-1DWLG to 3-3DWLG.

Figure 19:
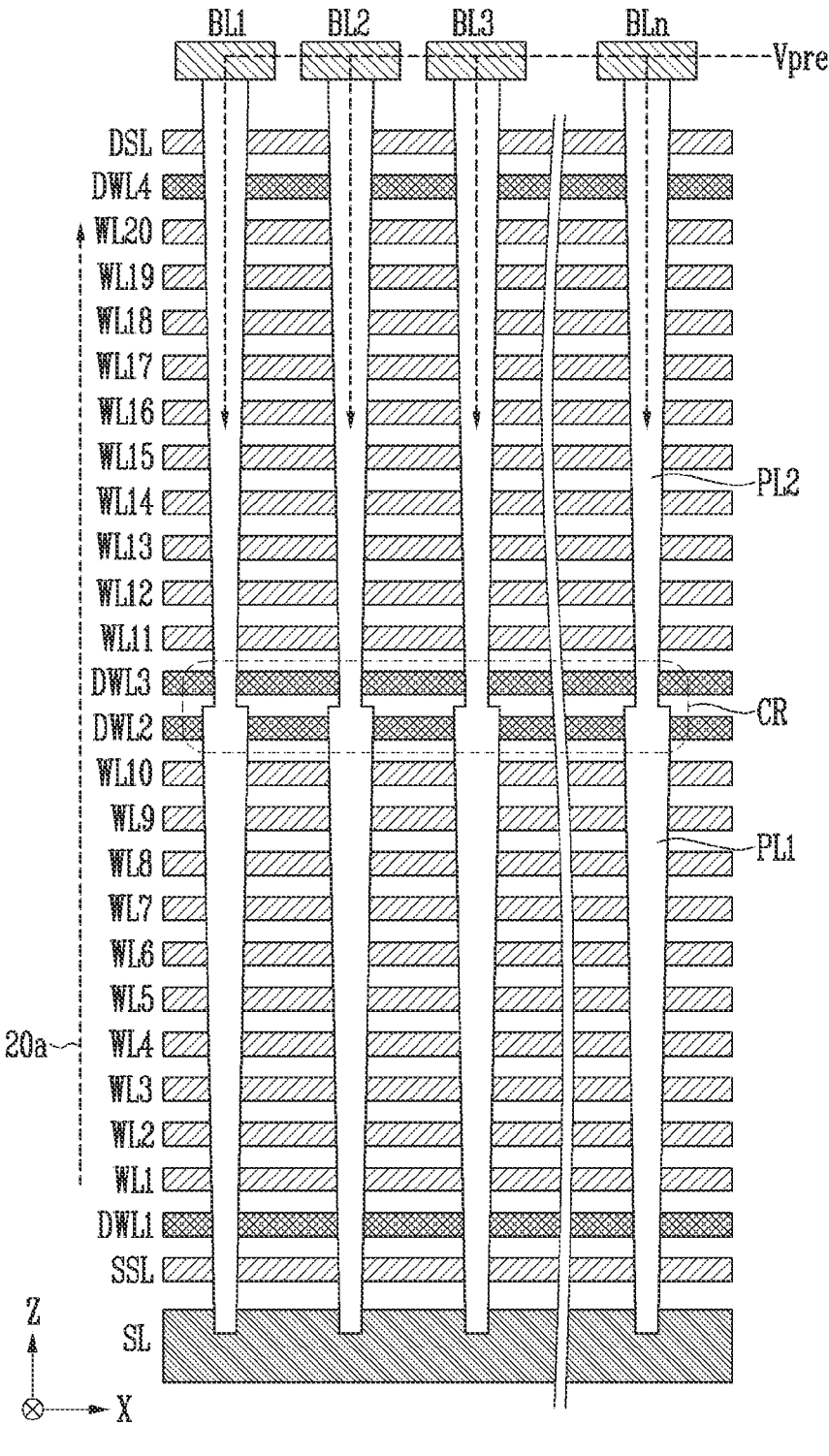
FIG. 19 is a sectional view of a memory block for explaining an eighth embodiment of the present disclosure.

FIG. 19 is a sectional view of a memory block for explaining an eighth embodiment of the present disclosure.

Referring to FIG. 19, although the structure of the memory block is identical to that of the memory block illustrated in FIG. 3, the order of program operations and the area to which a precharge voltage Vpre is applied are different from those in the embodiment illustrated in FIG. 3. Therefore, description of the structure of the memory block is made such that, during a program operation according to the eighth embodiment, the precharge voltage Vpre may be applied to strings through first to n-th bit lines BL1 to BLn, and the program operation may be performed from a first word line WL1 to a twentieth word line WL20 (20a). The program operation according to the eighth embodiment will be described in detail below.

Figure 20:
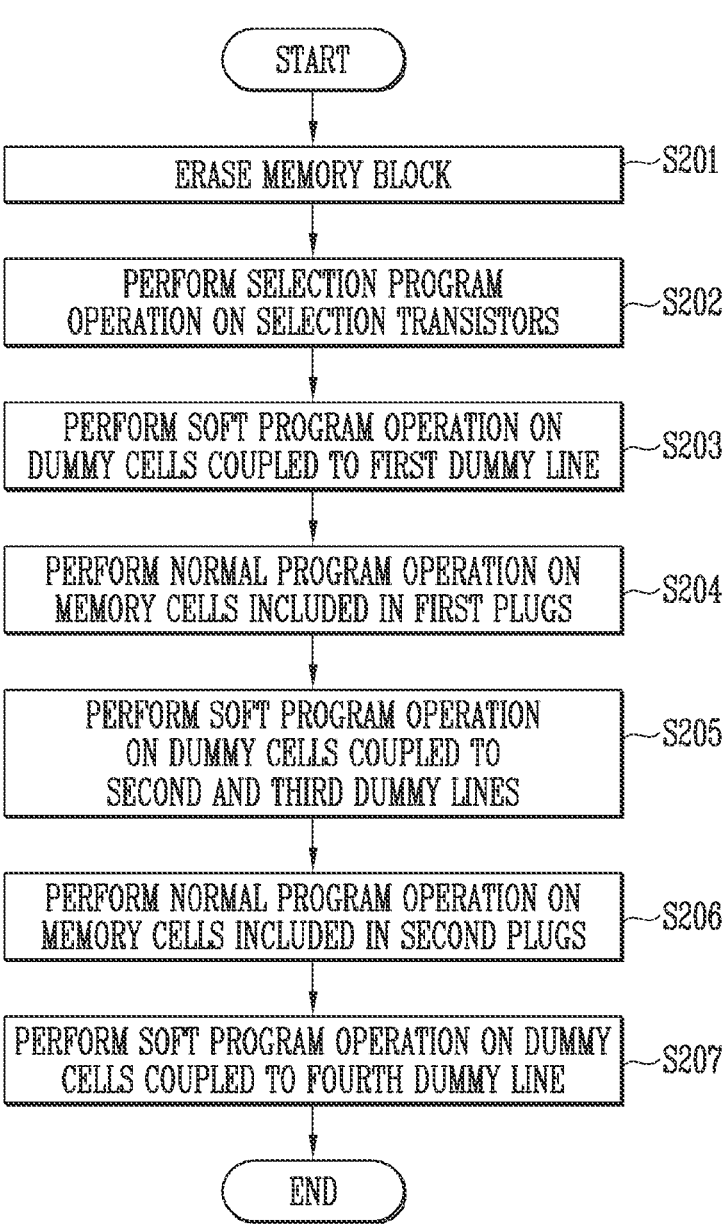
FIG. 20 is a flowchart illustrating a program operation according to an eighth embodiment of the present disclosure.

FIG. 20 is a flowchart illustrating a program operation according to an eighth embodiment of the present disclosure.

Referring to FIGS. 19 and 20, when an erase operation is performed on the memory block at step S201, a selection program operation may be performed on selection transistors at step S202. For example, the selection program operation may be performed to increase the threshold voltages of source selection transistors and drain selection transistors, which are decreased by the erase operation, up to a target select voltage.

When the threshold voltages of the selection transistors are increased to the target select voltage, a soft program operation that increases the threshold voltages of dummy cells coupled to a first dummy line DWL1 may be performed at step S203. For example, the soft program operation on the dummy cells coupled to the first dummy line DWL1 may be performed such that the threshold voltages of the dummy cells become higher than threshold voltages in an erase state. When the soft program operation on the dummy cells coupled to the first dummy line DWL1 is performed at step S203, dummy cells coupled to the remaining dummy lines, that is, second to fourth dummy lines DWL2 to DWL4, may be maintained in an erase state.

When the soft program operation on the dummy cells coupled to the first dummy line 1DWL is terminated, a normal program operation may be performed on memory cells included in first plugs PL1 at step S204. That is, the normal program operation may be performed on memory cells coupled between the first and second dummy lines DWL1 and DWL2. During the normal program operation on the memory cells included in the first plugs PL1, a positive precharge voltage Vpre may be applied through the first to n-th bit lines BL1 to BLn to increase the channel voltages of unselected strings. The normal program operation on the memory cells included in the first plugs PL1 may be performed from a first word line WL1 to a tenth word line WL10.

When the normal program operation performed on the memory cells included in the first plugs PL1 is terminated, a soft program operation may be performed on dummy cells coupled to the second and third dummy lines DWL2 and DWL3 at step S205. The soft program operation on the dummy cells coupled to the second and third dummy lines DWL2 and DWL3 may be performed to increase the threshold voltages of the dummy cells but may be performed to have threshold voltages that are lower than those of the dummy cells coupled to the first dummy line DWL1. When the soft program operation on the dummy cells coupled to the second and third dummy lines DWL2 and DWL3 is performed at step S205, dummy cells coupled to the fourth dummy line DWL4 may be maintained in an erase state.

When the soft program operation on the dummy cells coupled to the second and third dummy lines DWL2 and DWL3 is terminated, a normal program operation may be performed on memory cells included in second plugs PL2 at step S206. That is, the normal program operation may be performed on memory cells coupled between the third and fourth dummy lines DWL3 and DWL4. During the normal program operation on the memory cells included in the second plugs PL2, the positive precharge voltage Vpre may be applied through the first to n-th bit lines BL1 to BLn to increase the channel voltages of unselected strings. The normal program operation on the memory cells included in the second plugs PL2 may be sequentially performed in the order from eleventh memory cells MC11 to twentieth memory cells MC20.

When the normal program operation on the memory cells included in the second plugs PL2 is terminated, a soft program operation may be performed on dummy cells coupled to the fourth dummy line DWL4 at step S207. The soft program operation on the dummy cells coupled to the fourth dummy line DWL4 may be performed to increase the threshold voltages of the dummy cells coupled to the fourth dummy line DWL4. The threshold voltages of the dummy cells coupled to the fourth dummy line DWL4 may be lower than or equal to the threshold voltages of dummy cells coupled to the second or third dummy line DWL2 or DWL3.

Figure 21:
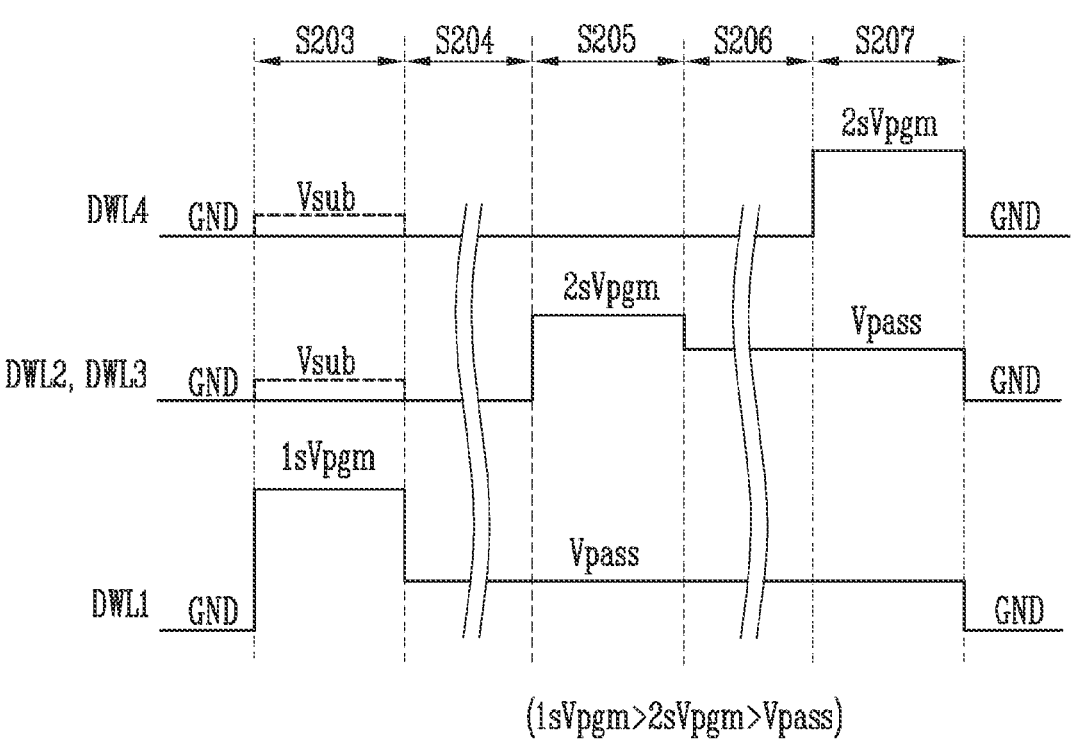
FIG. 21 is a timing diagram illustrating the program operation according to the eighth embodiment of the present disclosure.

FIG. 21 is a timing diagram illustrating the program operation according to the eighth embodiment of the present disclosure.

Referring to FIGS. 20 and 21, when the program operation on the memory block begins, a first soft program voltage 1sVpgm for a soft program operation on dummy cells coupled to the first dummy line DWL1 closest to a source line SL, among the first to fourth dummy lines DWL1 to DWL4, may be applied at step S203. Here, a ground voltage GND or a positive sub-voltage Vsub may be applied to the second to fourth dummy lines DWL2 to DWL4 so that the dummy cells are maintained in an erase state. Here, the sub-voltage Vsub may be set to a low positive voltage so that the first to third dummy cells DC1 to DC3 are not changed to a program state. For example, the sub-voltage Vsub may be set to a value between 0 V and 1 V. The ground voltage GND may be 0 V.

After step S203 is terminated, a normal program operation may be performed on memory cells included in the first plugs PL1 at step S204. While the normal program operation is being performed on the memory cells, the pass voltage Vpass for turning on the dummy cells may be applied to the first dummy line DWL1, and the ground voltage GND may be applied to the second to fourth dummy lines DWL2 to DWL4.

After step S204 is terminated, a second soft program voltage 2sVpgm for a soft program operation on the dummy cells coupled to the second and third dummy lines DWL2 and DWL3 may be applied at step S205. The second soft program voltage 2sVpgm may be set to a voltage that is lower than the first soft program voltage 1sVpgm. During the soft program operation on the dummy cells coupled to the second and third dummy lines DWL2 and DWL3, the pass voltage Vpass may be applied to the first dummy line DWL1, and the ground voltage GND may be applied to the fourth dummy line DWL4. Because the pass voltage Vpass is a voltage for turning on dummy cells, it may be set to a positive voltage. The second soft program voltage 2sVpgm may be higher than the pass voltage Vpass, and the first soft program voltage 1sVpgm may be higher than the second soft program voltage 2sVpgm.

After step S205 is terminated, a normal program operation may be performed on memory cells included in the second plugs PL2 at step S206. While the normal program operation is being performed on the memory cells, the pass voltage Vpass for turning on the dummy cells may be applied to the first to third dummy lines DWL1 to DWL3, and the ground voltage GND may be applied to the fourth dummy line DWL4.

After step S206 is terminated, a second soft program voltage 2sVpgm for a soft program operation on dummy cells coupled to the fourth dummy line DWL4 may be applied at step S207. Here, the pass voltage Vpass may be applied to the first to third dummy lines DWL1 to DWL3.

Figure 22:
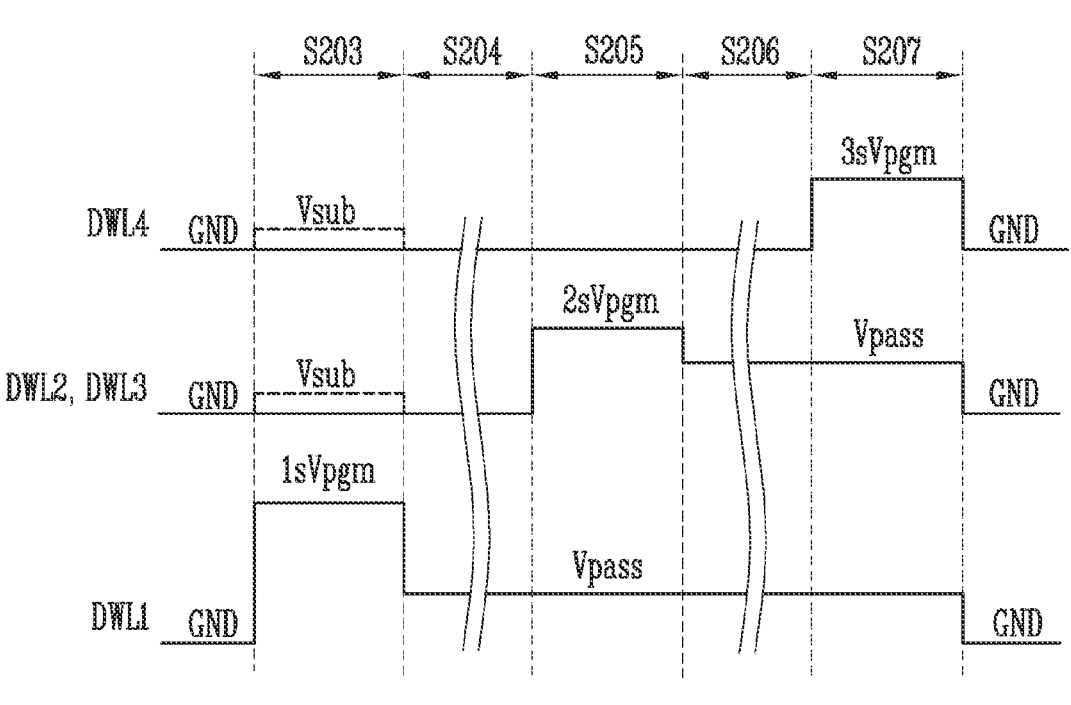
FIG. 22 is a timing diagram illustrating a program operation according to a ninth embodiment of the present disclosure.

FIG. 22 is a timing diagram illustrating a program operation according to a ninth embodiment of the present disclosure.

Referring to FIGS. 20 and 22, during a program operation according to a ninth embodiment, a relatively low soft program voltage may be applied to dummy lines closer to first to n-th bit lines BL1 to BLn to which the precharge voltage Vpre is applied.

When the program operation on the memory block begins, a first soft program voltage 1sVpgm for a soft program operation on dummy cells coupled to the first dummy line DWL1 closest to a source line SL, among the first to fourth dummy lines DWL1 to DWL4, may be applied at step S203. Here, a ground voltage GND or a positive sub-voltage Vsub may be applied to the second to fourth dummy lines DWL2 to DWL4 so that the dummy cells are maintained in an erase state. Here, the sub-voltage Vsub may be set to a low positive voltage so that the first to third dummy cells DC1 to DC3 are not changed to a program state. For example, the sub-voltage Vsub may be set to a value between 0 V and 1 V. The ground voltage GND may be 0 V.

After step S203 is terminated, a normal program operation may be performed on memory cells included in the first plugs PL1 at step S204. While the normal program operation is being performed on the memory cells, the pass voltage Vpass for turning on the dummy cells may be applied to the first dummy line DWL1, and the ground voltage GND may be applied to the second to fourth dummy lines DWL2 to DWL4.

After step S204 is terminated, a second soft program voltage 2sVpgm for a soft program operation on the dummy cells coupled to the second and third dummy lines DWL2 and DWL3 may be applied at step S205. The second soft program voltage 2sVpgm may be set to a voltage that is lower than the first soft program voltage 1sVpgm. During the soft program operation on the dummy cells coupled to the second and third dummy lines DWL2 and DWL3, the pass voltage Vpass may be applied to the first dummy line DWL1, and the ground voltage GND may be applied to the fourth dummy line DWL4. Because the pass voltage Vpass is a voltage for turning on dummy cells, it may be set to a positive voltage. The second soft program voltage 2sVpgm may be higher than the pass voltage Vpass, and the first soft program voltage 1sVpgm may be higher than the second soft program voltage 2sVpgm.

After step S205 is terminated, a normal program operation may be performed on memory cells included in the second plugs PL2 at step S206. While the normal program operation is being performed on the memory cells, the pass voltage Vpass for turning on the dummy cells may be applied to the first to third dummy lines DWL1 to DWL3, and the ground voltage GND may be applied to the fourth dummy line DWL4.

After step S206 is terminated, a third soft program voltage 3sVpgm for a soft program operation on dummy cells coupled to the fourth dummy line DWL4 may be applied. The third soft program voltage 3sVpgm may be set to a voltage that is lower than the second soft program voltage 2sVpgm. During the soft program operation on the dummy cells coupled to the fourth dummy line DWL4, the pass voltage Vpass may be applied to the first to third dummy lines DWL1 to DWL3.

Figure 23:
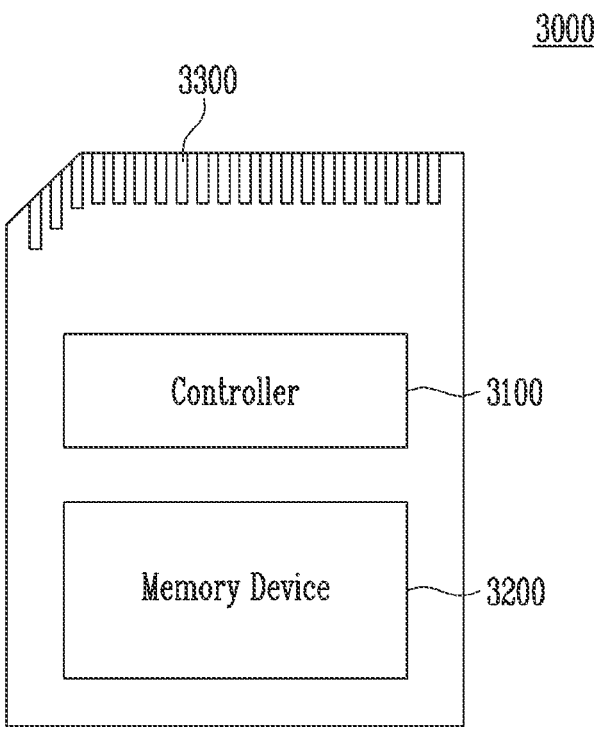
FIG. 23 is a diagram illustrating a memory card system to which a memory device according to an embodiment of the present disclosure is applied.

FIG. 23 is a diagram illustrating a memory card system to which a memory device according to an embodiment of the present disclosure is applied.

Referring to FIG. 23, a memory card system 3000 may include a controller 3100, a memory device 3200, and a connector 3300.

The controller 3100 may be coupled to the memory device 3200. The controller 3100 may access the memory device 3200. For example, the controller 3100 may control a program operation, a read operation, or an erase operation of the memory device 3200 or may control a background operation of the memory device 3200. The controller 3100 may provide an interface between the memory device 3200 and a host. The controller 3100 may run firmware that controls the memory device 3200. In an example, the controller 3100 may include components, such as a random access memory (RAM), a processor, a host interface, a memory interface, and an error correction circuit.

The controller 3100 may communicate with an external device through the connector 3300. The controller 3100 may communicate with an external device (e.g., a host) based on a specific communication standard. In an embodiment, the controller 3100 may communicate with the external device through at least one of various communication standards such as universal serial bus (USB), multimedia card (MMC), embedded MMC (eMMC), peripheral component interconnection (PCI), PCI-express (PCI-E), advanced technology attachment (ATA) protocol, serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and nonvolatile memory express (NVMe). In an embodiment, the connector 3300 may be defined by at least one of the above-described various communication standards.

The memory device 3200 may include a plurality of memory cells and may be configured in the same manner as the memory device 100 illustrated in FIG. 1. Therefore, the memory device 3200 may control a soft program operation that increases the threshold voltages of dummy cells.

The controller 3100 and the memory device 3200 may be integrated into a single semiconductor device to form a memory card. For example, the controller 3100 and the memory device 3200 may be integrated into a single semiconductor device and may then form a memory card, such as a personal computer memory card international association (PCMCIA) card, a compact flash card (CF), a smart media card (SM or SMC), a memory stick, a multimedia card (MMC, RS-MMC, MMCmicro or eMMC), an SD card (SD, miniSD, microSD, or SDHC), or a universal flash storage (UFS).

Figure 24:
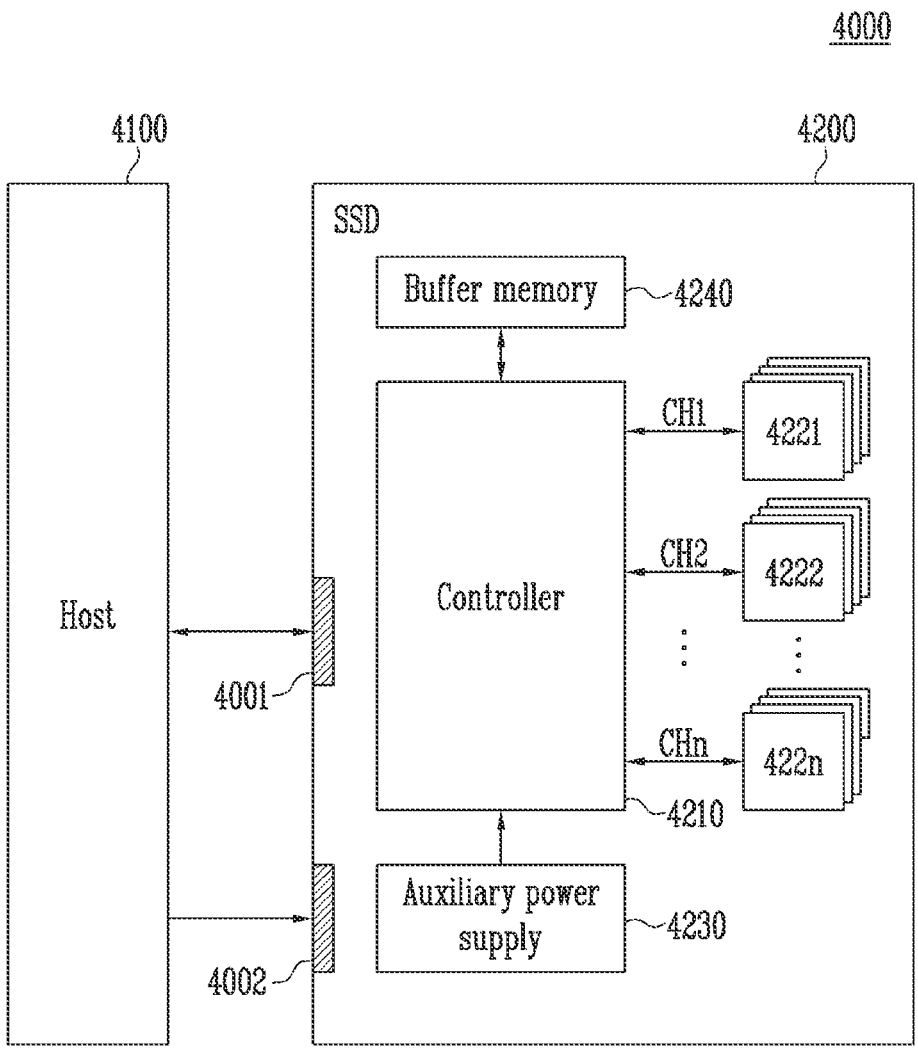
FIG. 24 is a diagram illustrating a solid state drive (SSD) system to which a memory device according to the present disclosure is applied.

FIG. 24 is a diagram illustrating a solid state drive (SSD) system to which a memory device according to the present disclosure is applied.

Referring to FIG. 24, an SSD system 4000 may include a host 4100 and an SSD 4200. The SSD 4200 may exchange a signal with the host 4100 through a signal connector 4001 and may receive power through a power connector 4002. The SSD 4200 may include a controller 4210, a plurality of memory devices 4221 to 422n, an auxiliary power supply 4230, and a buffer memory 4240.

The controller 4210 may control the plurality of memory devices 4221 to 422n in response to signals received from the host 4100. In an embodiment, the received signals may be signals based on the interfaces of the host 4100 and the SSD 4200. For example, the signals may be defined by at least one of various interfaces, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and nonvolatile memory express (NVMe).

Each of the plurality of memory devices 4221 to 422n may include a plurality of memory cells configured to store data. Each of the memory devices 4221 to 422n may be configured in the same manner as the memory device 100, illustrated in FIG. 1. Therefore, each of the plurality of memory devices 4221 to 422n may control a soft program operation that increases the threshold voltages of dummy cells. The plurality of memory devices 4221 to 422n may communicate with the controller 4210 through channels CH1 to CHn.

The auxiliary power supply 4230 may be coupled to the host 4100 through the power connector 4002. The auxiliary power supply 4230 may be supplied with a supply voltage from the host 4100 and may be charged. The auxiliary power supply 4230 may provide the supply voltage of the SSD 4200 when the supply of power from the host 4100 is not smoothly performed. In an embodiment, the auxiliary power supply 4230 may be located inside the SSD 4200 or located outside of the SSD 4200. For example, the auxiliary power supply 4230 may be located in a main board and may provide auxiliary power to the SSD 4200.

The buffer memory 4240 may function as a buffer memory of the SSD 4200. For example, the buffer memory 4240 may temporarily store data received from the host 4100 or data received from the plurality of memory devices 4221 to 422n or may temporarily store metadata (e.g., mapping tables) of the memory devices 4221 to 422n. The buffer memory 4240 may include volatile memories, such as a dynamic random access memory (DRAM), a synchronous DRAM (SDRAM), a double data rate (DDR) SDRAM, and a low power DDR (LPDDR) SDRAM, or nonvolatile memories, such as a ferroelectric RAM (FRAM), a resistive RAM (ReRAM), a spin transfer torque magnetic RAM (STT-MRAM), and a phase-change RAM (PRAM).

The present disclosure may improve the reliability of a program operation performed on a memory device.

What is claimed is:

1. A memory device, comprising:
  a memory block including strings, each including first memory cells coupled between a first dummy cell and a second dummy cell and second memory cells coupled between a third dummy cell and a fourth dummy cell, the third dummy cell being adjacent to the second dummy cell; and a peripheral circuit configured to:

perform an erase operation on the memory block, after performing the erase operation on the memory block, perform a soft program operation on the fourth dummy cell, among the first to fourth dummy cells, which is farthest away from an area to which a precharge voltage is applied, and perform a normal program operation on the second memory cells, wherein the precharge voltage is applied to the area during the normal program operation, and wherein the area is adjacent to the first dummy cells, and after the normal program operation has been performed on the second memory cells, perform a soft program operation on the second and third dummy cells.

2. The memory device according to claim 1, wherein the peripheral circuit is configured to perform soft program operations on the second to fourth dummy cells such that threshold voltages of the second and third dummy cells are lower than threshold voltages of the fourth dummy cells.

3. The memory device according to claim 2, wherein the peripheral circuit is configured to perform the soft program operation on the second and third dummy cells such that the threshold voltages of the second and third dummy cells are equal to each other.

4. The memory device according to claim 2, wherein the peripheral circuit is configured to perform a soft program operation on the second and third dummy cells such that the threshold voltage of the second dummy cell is lower than the threshold voltage of the third dummy cell.

5. The memory device according to claim 1, wherein the peripheral circuit is further configured to, after the soft program operation has been performed on the second and third dummy cells, perform a normal program operation on the first memory cells.

6. The memory device according to claim 5, wherein the peripheral circuit is further configured to, after the normal program operation has been performed on the first memory cells, perform a soft program operation on the first dummy cell.

7. The memory device according to claim 6, wherein the peripheral circuit is configured to perform soft program operations on the first to third dummy cells such that threshold voltages of the first to third dummy cells are equal to each other.

8. The memory device according to claim 6, wherein the peripheral circuit is configured to perform soft program operations on the first to third dummy cells such that a threshold voltage of the first dummy cell is lower than threshold voltages of the second and third dummy cells.

* * * * *